United States Patent
Madsen et al.

(10) Patent No.: US 12,362,007 B2
(45) Date of Patent: Jul. 15, 2025

(54) MEMORY CONTROLLER SUPPORT FOR MIXED READ

(71) Applicant: Western Digital Technologies, Inc., San Jose, CA (US)

(72) Inventors: Rasmus Madsen, Copenhagen (DK); Lunkai Zhang, Portland, OR (US); Martin Lueker-Boden, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 175 days.

(21) Appl. No.: 18/360,096

(22) Filed: Jul. 27, 2023

(65) Prior Publication Data

US 2024/0404582 A1    Dec. 5, 2024

Related U.S. Application Data

(60) Provisional application No. 63/505,784, filed on Jun. 2, 2023.

(51) Int. Cl.
*G11C 11/4096*    (2006.01)
*G11C 11/4076*    (2006.01)
*G11C 11/408*     (2006.01)

(52) U.S. Cl.
CPC ...... *G11C 11/4096* (2013.01); *G11C 11/4076* (2013.01); *G11C 11/408* (2013.01)

(58) Field of Classification Search
CPC .................................................. G11C 11/4096
See application file for complete search history.

(56) References Cited

U.S. PATENT DOCUMENTS

| | | | |
|---|---|---|---|
| 6,216,178 B1 | 4/2001 | Stracovsky et al. | |
| 6,445,624 B1 | 9/2002 | Janzen et al. | |
| 9,025,364 B2* | 5/2015 | Kinney | G11C 11/16 365/158 |
| 9,299,411 B2 | 3/2016 | Alam et al. | |
| 9,715,419 B2 | 7/2017 | Kinney et al. | |
| 10,114,548 B2* | 10/2018 | Shin | G11C 8/18 |
| 10,114,589 B2 | 10/2018 | Ouyang et al. | |
| 10,275,352 B1* | 4/2019 | Balakrishnan | G06F 15/7821 |
| 10,585,735 B2 | 3/2020 | Kinney et al. | |
| 10,642,496 B2 | 5/2020 | Benisty et al. | |
| 2006/0095701 A1* | 5/2006 | Gower | G06F 13/1689 711/167 |
| 2009/0150636 A1 | 6/2009 | Gower et al. | |

* cited by examiner

*Primary Examiner* — Douglas King
(74) *Attorney, Agent, or Firm* — Pearl Cohen Zedek Latzer Baratz LLP

(57) ABSTRACT

Technology is disclosed for controlling reads in a memory device supporting different types of reads having different performance times (e.g., a relatively fast read such as a globally-referenced read and a slower read such as a self-referenced read). The data out latencies of the different read types may be different to accommodate the different performance times. The memory controller may mix the different types of reads. The memory controller tracks expected usage of the data bus and schedules read commands accordingly to avoid data collisions. A countdown timer may be used to track the earliest clock cycle at which the memory device may return data for a new read command to be issued. The memory controller may record what clock cycles the data bus is projected to be occupied with data and schedule read commands based on the projected data bus occupancy to avoid data collisions.

20 Claims, 16 Drawing Sheets

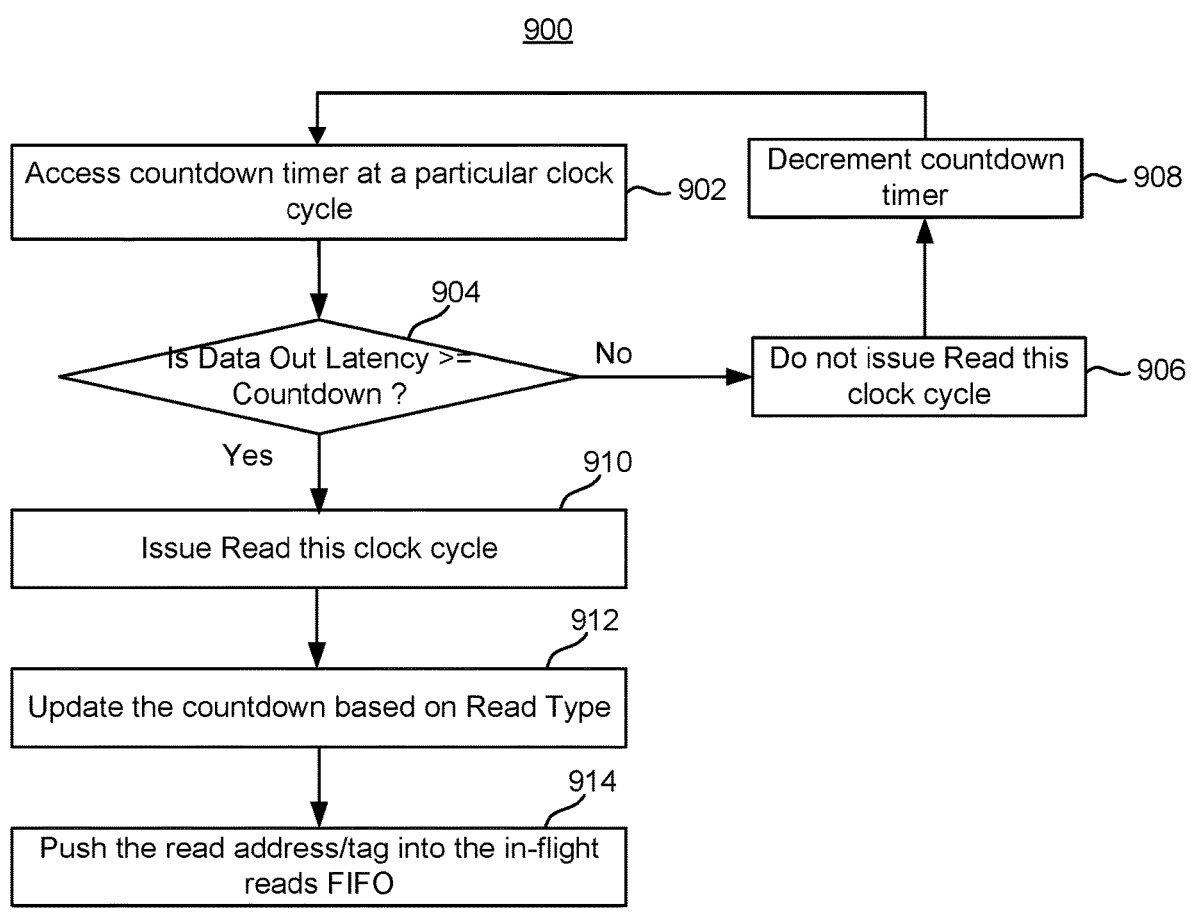

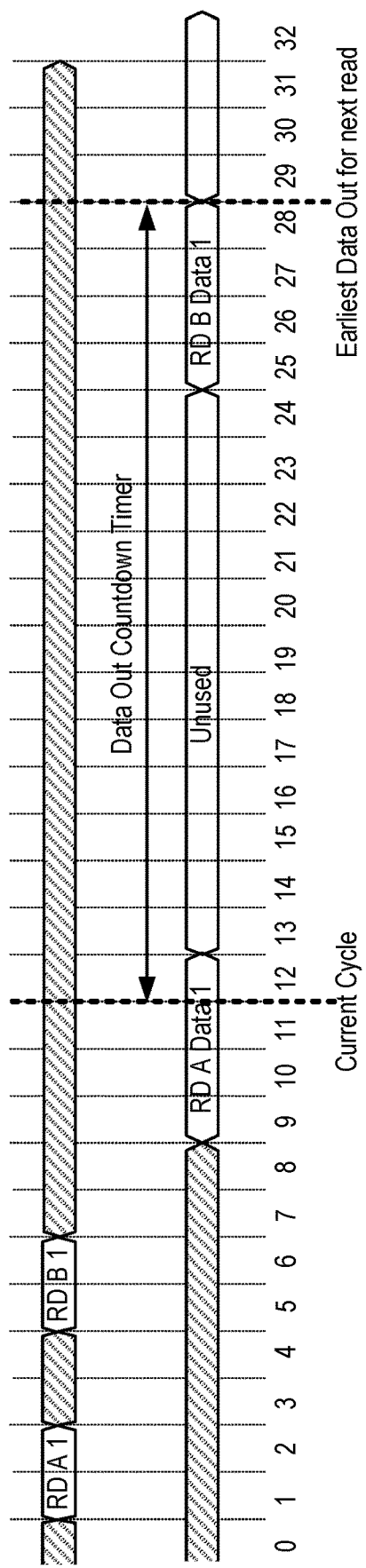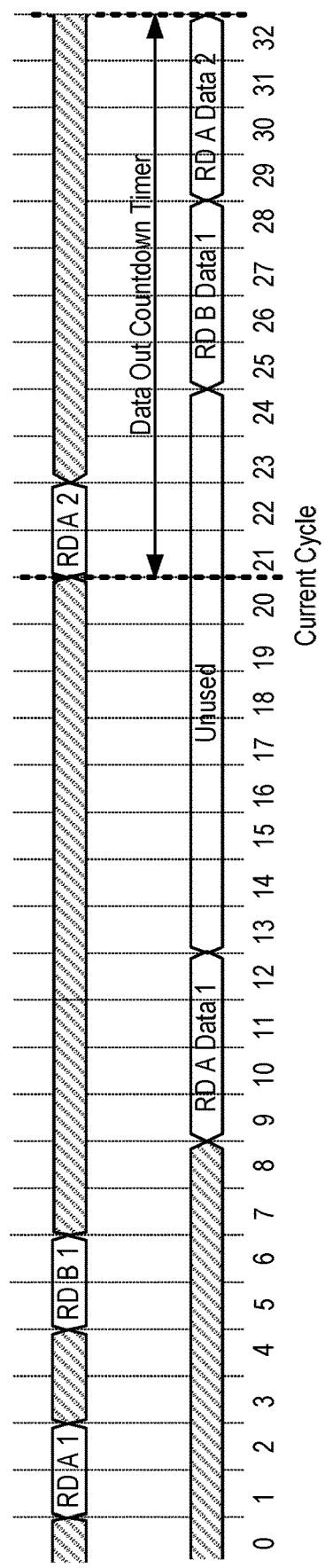

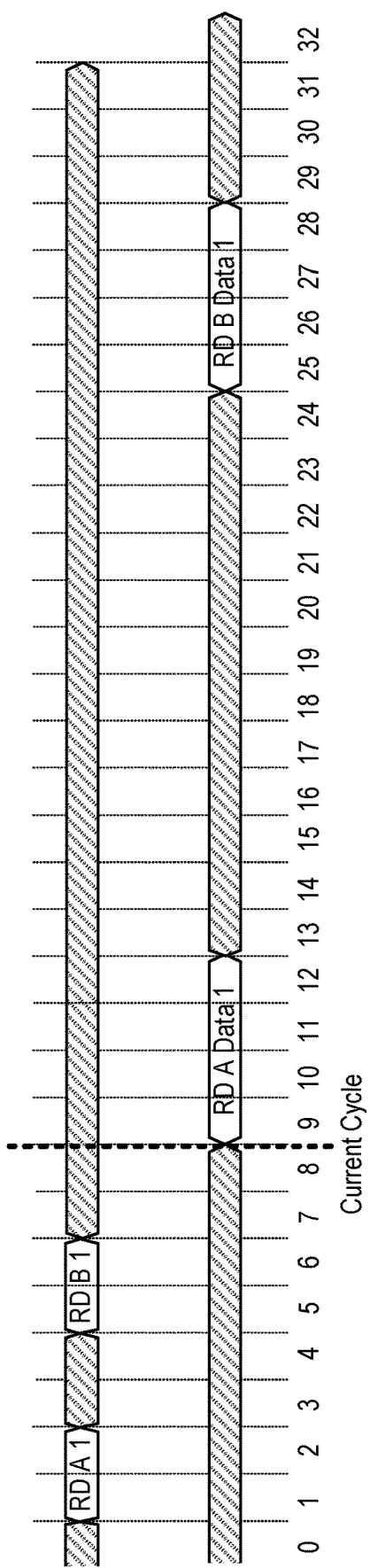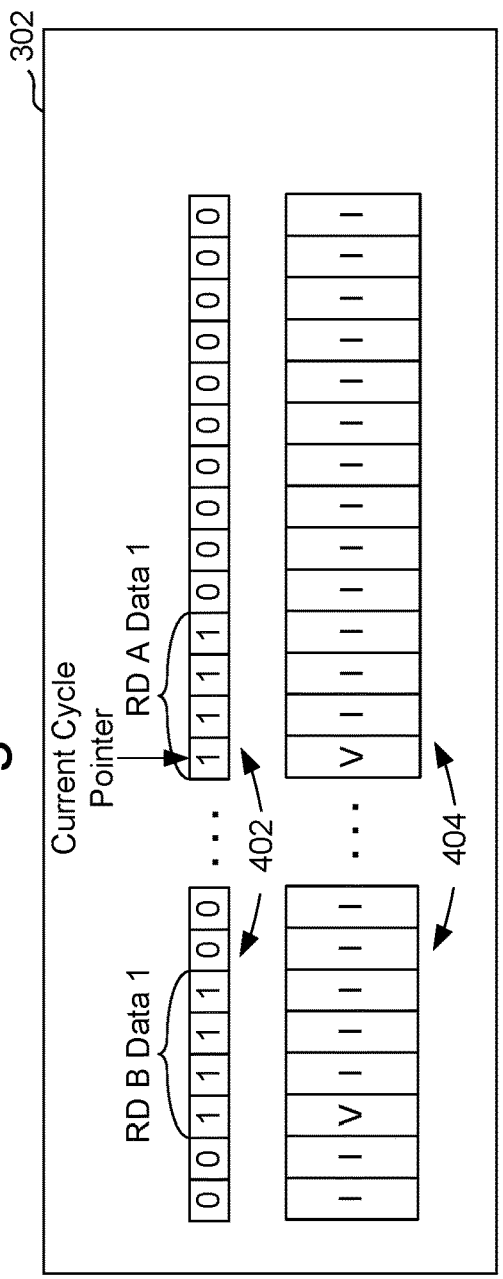

MEMORY CONTROLLER SUPPORT FOR MIXED READ

CLAIM OF PRIORITY

The present application claims priority from U.S. Provisional Patent Application No. 63/505,784, entitled "MEMORY CONTROLLER SUPPORT FOR MIXED READ," by Madsen et al., filed Jun. 2, 2023, incorporated by reference herein in its entirety.

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. Non-volatile memory retains information even when not connected to a power source. Volatile memory is not required to retain information when not connected to a power source.

One common type of non-volatile memory is flash, which may include NAND-type flash or NOR-type flash. One type of volatile memory is dynamic random access memory (DRAM). DRAM is commonly used in main memory. DRAM suffers from a need to frequently refresh the memory. Another type of volatile memory is static random access memory (SRAM). SRAM does not have the drawback of requiring frequent refreshes, but can be more expensive per it than DRAM.

Newer types of memory are emerging ("emerging memories"). Emerging memories include, but are not limited to, magnetoresistive random access memory (e.g., MRAM, Spin Transfer Torque MRAM, Spin Orbit Torque MRAM), resistive random access memories (ReRAM), phase change memory (PCM), and ferroelectric RAM (FeRAM). Some of the emerging memories could potentially be used as non-volatile memory due to their ability to retain information without power. It has been proposed that some of the emerging memories (e.g., MRAM) could potentially be used as a replacement for volatile memory such as DRAM.

One type of memory cell is a programmable resistance memory cell. A programmable resistance memory cell is formed from a material having a programmable resistance. In a binary approach, the programmable resistance memory cell can be programmed into one of two resistance states: high resistance state (HRS) and low resistance state (LRS). In some approaches, more than two resistance states may be used. One type of programmable resistance memory cell is a MRAM cell. An MRAM cell uses magnetization to represent stored data, in contrast to some other memory technologies that use electronic charges to store data. A bit of data is written to an MRAM cell by changing the direction of magnetization of a magnetic element ("the free layer") within the MRAM cell, and a bit is read by measuring the resistance of the MRAM cell.

A memory system may contain a memory controller and one or more memory devices that contain the memory cells. An example of a memory device is a DRAM chip; however, there are many other types of memory devices. A communication interface having a number of signal lines links the memory controller with the memory device(s). The memory controller may use certain signal lines to issue commands such as read and write, as well as the address to be read or written. A different set of signal lines ("data lines" or "data bus") may be used to transfer the data between the memory controller and the memory device(s).

When the memory controller issues a read command to a memory device the memory controller may expect that the memory device will begin to transfer the data on the data lines a certain number of clock cycles after the read command was issued. FIG. 1 depicts a conventional timing diagram of a command (CMD) signal and a data signal. The CMD signal shows six read commands being issued over time. These read commands might be issued to different memory banks. Each read command is the same type of read command and has the same Data Out Latency, which in this example is eight clock cycles. Herein, the term "data out latency" is used to refer to this latency between the issuance of a read command from the memory controller and the time that the memory device begins to transfer the data on the data lines. It will take a certain number of cycles for the memory device to transfer all of the data for that read command on the data lines, which is referred to herein as the "read data cycles." In the example in FIG. 1, each read command has a read data cycles of four clock cycles. Thus, for each read command the data lines will be occupied for an amount of time equal to the read data cycles. Also note that the data is returned in the same order as the read commands are issued. Further note that some conventional memories (e.g., DDR memories) only support a single read type, so all the reads have the same timing requirements, such as Next_Read_Latency (e.g., tRC in DDR5) and Data_Out_Latency (i.e., CL in DDR5).

One potential issue in memory systems is a data collision on the data lines. A data collision occurs if there is overlapping transfer of data for two different commands over the same set of data lines. Some architectures, such as DRAM, have provisions that reduce or eliminate the chance of a data collision on the data lines. For example, for typical DRAM the data out latency for a DRAM chip is uniform, which simplifies the avoidance of data collisions. Also, a DRAM memory controller may expect the data to be returned from the memory device in the same order as the read commands were issued, which is referred to herein as "in-order data read-out." The assurance of in-order data read-out simplifies the avoidance of data collisions. The assurance of in-order data read-out also simplifies the internal working of the memory controller to match the data returned from the memory device with the correct read command.

Emerging memories may operate in fundamentally different ways than more traditional memories such as NAND, NOR, DRAM, SRAM, etc. For example, techniques to read emerging memories may be quite different than techniques to read more traditional memories. Therefore, challenges arise when providing a memory controller for emerging memories. These challenges may be especially acute if the emerging memory is to replace a more traditional memory. For example, memory controllers that were deigned to operate with traditional memories may be constructed to reflect traditional reading techniques. As one example, a memory controller that is designed to operate with DRAM may expect a single data out latency.

However, it has been proposed that some emerging memories could support multiple types of reads that take different amounts of time to perform within the memory device. One type of read is a globally-referenced read in which a condition of the memory cell is compared to a reference signal, such as a reference voltage. Since the same reference signal may be used for many different memory cells, the read may be referred to as being globally-referenced. A globally-referenced read is sometimes referred to as a midpoint read or midpoint referenced read. A globally-referenced read may use a reference that is between the lower resistance state (LRS) and the higher resistance state (HRS) of a programmable resistance memory cell. For example, the midpoint reference may be a reference voltage that is midway between two voltages that correspond to sensing the cell having either the LRS or the HRS. A signal is applied to the memory cell to determine the condition of the memory cell. For example, a voltage may be applied across the memory cell resulting in a current having a magnitude that is representative of the resistance of the memory cell. The current may be converted to a sample voltage, which is compared to the reference voltage. The memory cell's state is determined based on whether the sample voltage is higher or lower than the reference voltage.

Another technique for reading programmable resistance memory cells is commonly referred to as a self-referenced read (SRR). In a SRR rather than using a midpoint reference that is independent of the state of the cell, the reference is generated based on sensing the cell itself. In a destructive SRR it is possible that the state of the memory cell is changed (e.g., destroyed) by a write operation of the SRR. One SRR technique includes a first read, a destructive write to a known state (e.g., the HRS), and a second read. The results of the two reads are compared to determine the original state of the cell. An SRR can provide for a more accurate determination of the memory cell's state than a globally-referenced read. However, the SRR may take considerably longer to perform within the memory device.

BRIEF DESCRIPTION OF THE DRAWINGS

Like-numbered elements refer to common components in the different figures.

FIG. 9 is a flowchart of one embodiment of a process of controlling issuance of read commands to the memory device.

FIGS. 10A and 10B show example timing diagrams of a command (CMD) signal and a data signal for one embodiment of the memory system.

FIG. 12A is a timing diagram for an in-order data return example.

FIG. 12B depicts an embodiment of a data bus occupancy recorder data structure that is consistent with the timing diagram of FIG. 12A.

DETAILED DESCRIPTION

Figure 1:
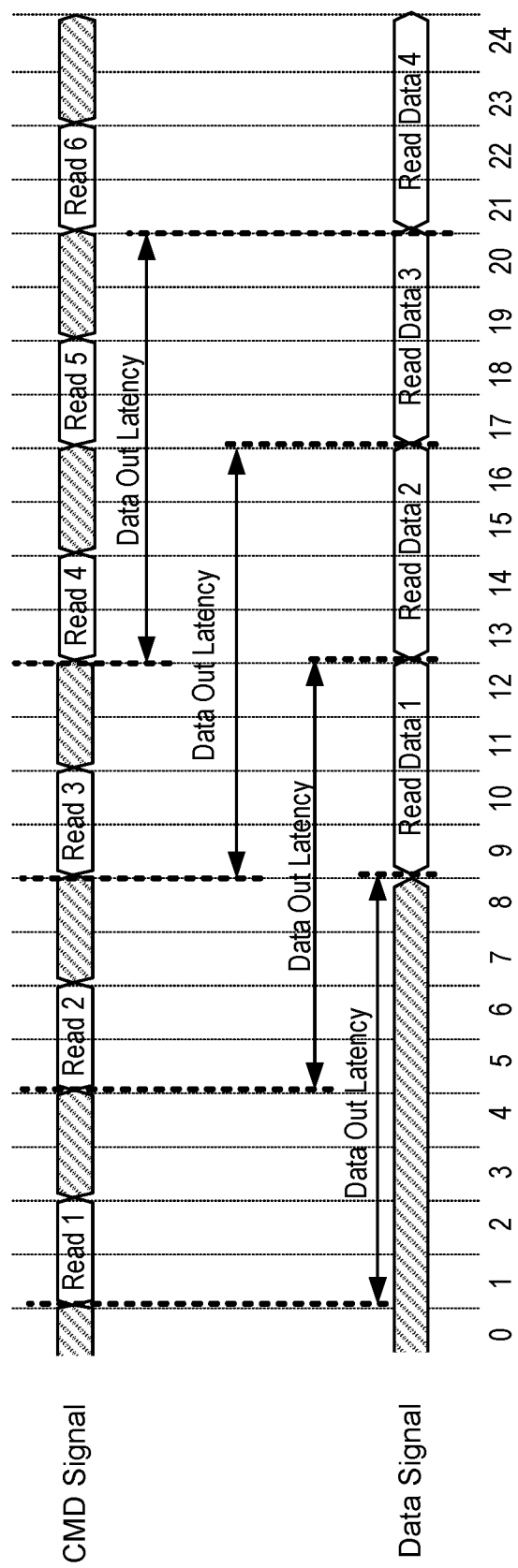
FIG. 1 depicts a conventional timing diagram of a command (CMD) signal and a data signal.

Technology is disclosed herein for controlling reads in a memory device that supports different types of reads that take significantly different times to perform within the memory device. As one example, the memory device may support a relatively fast performance read such as a globally-referenced read and a slower performance read such as an SRR. Moreover, the data out latencies of the different types of reads may be different to accommodate the different performance time of each type of read.

The memory controller may mix the different types of reads, which is referred to herein as a mixed read. The memory controller may select whether to send a first type of read command to perform the relatively fast read or instead send a second type of read command to perform a slower read. Note that some conventional memory protocols may require that the memory device have only one data out latency, which would in effect force the memory device to have the longer data out latency for both the faster performing read and the slower performing read. However, because an embodiment of the memory system is permitted to have different data out latencies for the different types of read commands a shorter data out latency may be used for the faster performing read and a longer data out latency may be used for the slower performing read. Therefore, bandwidth is improved.

However, having multiple data out latencies could present technical challenges in preventing data bus collisions. Embodiments of a memory controller track expected usage of the data bus and schedule read commands accordingly to avoid data collisions. In one embodiment, a countdown timer is used to track the earliest clock cycle at which the memory device may return data for a new read command to be issued. The countdown timer may be reset upon issuance of a read command based on the sum of the data out latency and read cycles for that read command. In one embodiment, the memory controller schedules read commands based on their respective data out latencies and the aforementioned earliest clock cycle at which the memory device may return data.

In one embodiment, the memory controller has a data bus occupancy recorder that records what clock cycles the data bus is projected to be occupied with data. In one embodiment, the memory controller schedules read commands based on the data bus occupancy recorder to avoid data collisions.

Having multiple data out latencies could result in data being returned out of order. For example, the memory controller may issue a read command for a slower performing read with longer data out latency prior to issuing a read command for a faster performing read with shorter data out latency. However, the memory device could complete the faster performing read prior to the slower performing read, and therefore return the data for the faster performing read prior to returning the data for the slower performing read. Some memory protocols are not designed to permit such out of order return of the data. However, embodiments of a memory system permit and properly process out of order return of the data. In one embodiment, the data bus occupancy recorder tracks information that allows proper processing even if the memory device returns the data out of order.

Figure 2:
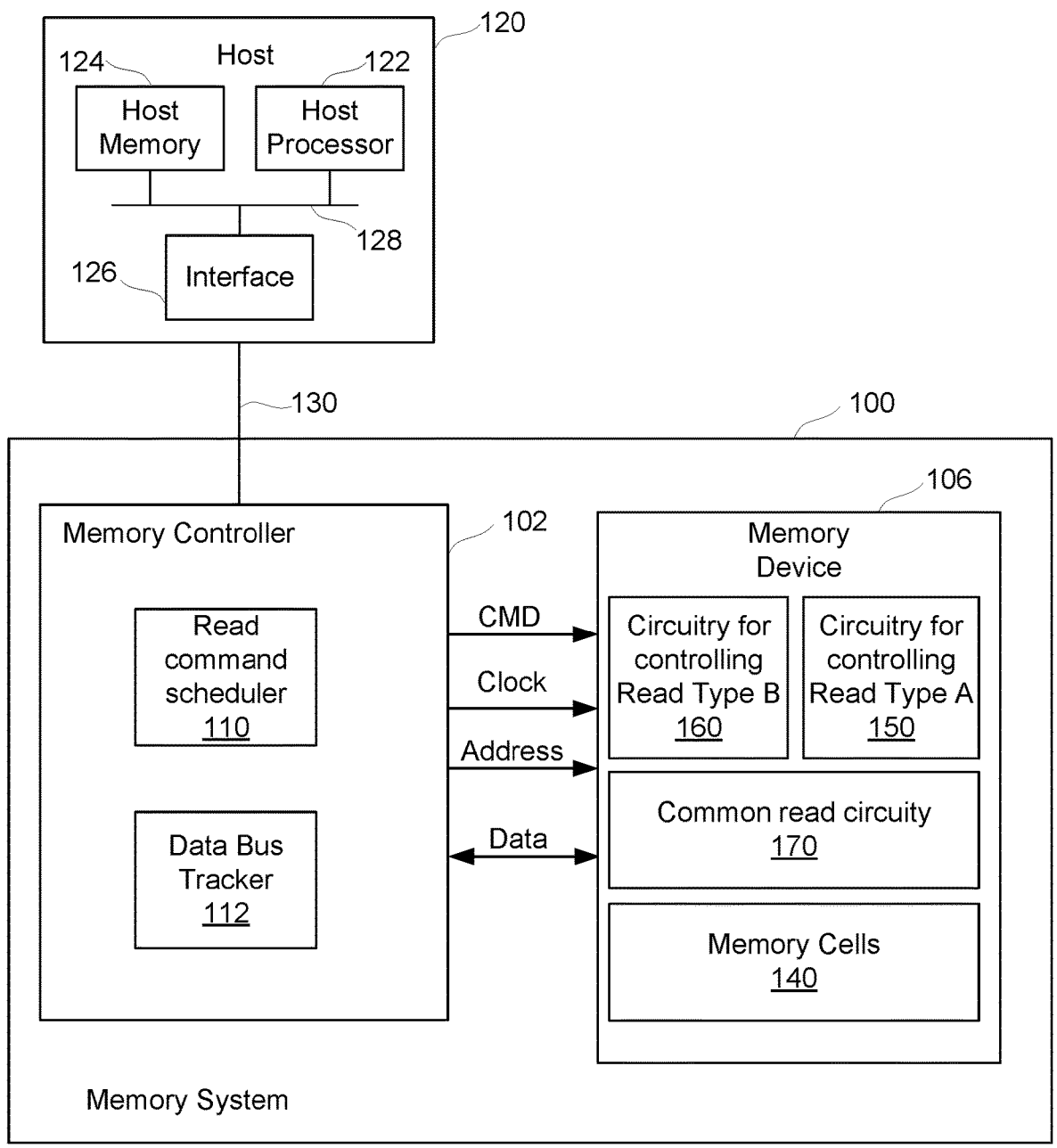
FIG. 2 is a block diagram of one embodiment of a non-volatile memory system having a memory controller and a memory device.

FIG. 2 is a block diagram of one embodiment of a memory system 100 having a memory controller and a memory device. Memory system 100 can implement the technology presented herein for supporting multiple types of reads having different data out latencies. Example memory systems include dual in-line memory modules (DIMMs), solid state drives ("SSDs"), memory cards and embedded memory devices; however, other types of memory systems can also be used. Many types of memory systems can be used with the technology proposed herein.

Memory system 100 of FIG. 2 comprises a memory controller 102 and memory device 106 for storing data. While one memory device 106 is depicted, the memory system 100 could have multiple memory devices 106. The memory controller 102 may control a number of memory devices 106. In an embodiment each memory device 106 includes a semiconductor die. The memory device 106 has memory cells 140. In some embodiments, the memory cells each have a programmable resistance memory element. In an embodiment, the memory cells each have a programmable resistance memory element (e.g., MRAM element) in series with a threshold switching selector such as an Ovonic Threshold Switch (OTS). Examples of the memory cells 140 include, but are not limited to, magnetoresistive random access memory (e.g., MRAM, Spin Transfer Torque MRAM, Spin Orbit Torque MRAM), resistive random access memories (ReRAM), phase change memory (PCM), and ferroelectric RAM (FeRAM).

The memory device 106 is capable of performing multiple types of reads, which may have different performance times. The performance time refers to the typical time it takes to complete the read within the memory device 106. The memory device 106 has circuitry for controlling read type A 150 and circuitry for controlling read type B 160. For purpose of discussion Read Type A may be referred to as a fast read and Read Type B may be referred to as a slower read. In one embodiment, Read Type A is a globally-referenced read and Read Type B is a self-referenced read. However, Read Type A and Read Type B could each be other types of read that have different performance times within the memory device 106. The memory device 106 also common read circuitry 170 which may include components such as sense amplifiers, decoders, and drivers. The drivers typically will include voltage drivers and in some embodiments include current drivers. The read type A circuitry 150 and the read type B circuitry 160 each control the common read circuitry 170. In an embodiment, at least a portion of the read type A circuitry 150 and the read type B circuitry 160 are part of a state machine that controls the memory operations on the memory device. However, the read type B circuitry 160 and/or the read type A circuitry 150 and could include components external to the state machine. For example, the read type B circuitry 160 may include charge storage devices for storing the value of a first read of an SRR for comparison with a second read of the SRR. In some embodiments the memory cells are read as a group that store an ECC codeword. In some embodiments, the Read Type A circuitry 150 may read one group of cells while the Read Type B circuitry 160 is reading a different group of cells.

The memory controller 102 and memory device 106 are connected by a communication interface that includes a command (CMD) bus, address bus, data bus, and a clock. The command bus, address bus, and clock may be unidirectional (to the memory device). The data bus may be bi-directional to support both read and write. The memory controller 102 has a read command scheduler 110 that schedules read commands to the memory device. The memory controller 102 issues the read commands on the CMD bus. The memory device 106 will return the data on the data bus. The data bus may also be referred to herein as data lines. The memory controller 102 has a data bus tracker 112 that tracks expected usage of the data bus. The expected usage is based on when the memory device 106 is expected to return data in response to read commands sent to the memory device 106. The read command scheduler 110 uses this data bus expected usage to determine when (e.g., what clock cycle) to issue read commands. The read command scheduler 110 and data bus tracker 112 may be implemented in hardware, software (e.g., firmware) or a combination of hardware and software.

The memory cells 140 may be volatile or non-volatile. Herein, volatile memory means that the memory cells 140 are not required to retain data after power off. In one embodiment in which the memory cells are MRAM cells the memory cells are not required to retain data after power-off. In one embodiment in which the memory cells are MRAM cells the memory cells retain data after power-off.

Host system 120 is external to and separate from memory system 100. In one embodiment, memory system 100 is embedded in host system 120. Memory controller 102 communicates with host system 120 via an interface 130 that implements a protocol such as, for example, Compute Express Link (CXL). For working with memory system 100, host system 120 includes a host processor 122, host memory 124, and interface 126 connected along host bus 128. Host memory 124 is the host's physical memory, and can be DRAM, SRAM, ReRAM, MRAM, non-volatile memory, or another type of memory. In an embodiment, memory controller 102 processes read requests from host 120 to access memory device 106. However, memory controller 102 could also access memory device based on its own requests. For example, memory device 106 could be the memory controller's own local memory. The components of memory system 100 depicted in FIG. 1 are electrical circuits.

Figure 3A:
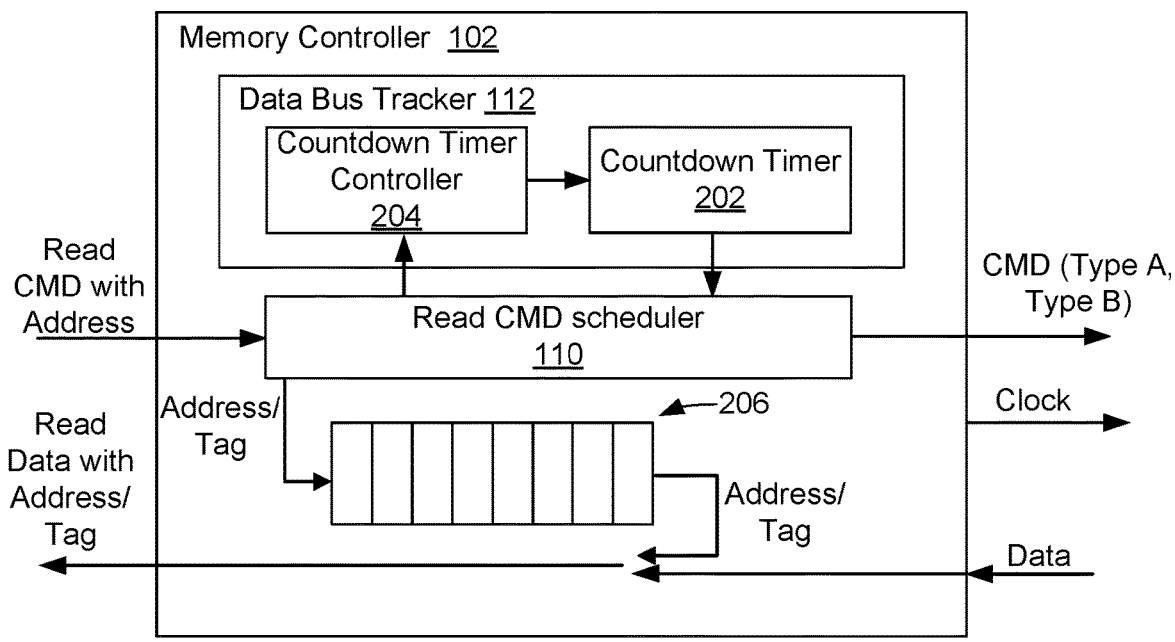
FIG. 3A depicts one embodiment of the memory controller.

FIG. 3A depicts one embodiment of the memory controller 102. In an embodiment, the data bus tracker 112 uses a countdown timer 202 to track expected usage of the data bus. Briefly, the countdown timer 202 may point to an earliest time slot (e.g., clock cycle) for which the read CMD scheduler 110 may issue a new read command to the memory device. The countdown time controller 204 updates the timer whenever a new read command is issued. In an embodiment, the countdown timer 202 is reset by an amount equal to the sum of the data out latency and read data cycles of the newly issued read command. The countdown timer 202 may be decremented each idle clock cycle for which no new read command is issued.

The read CMD scheduler 110 inputs read commands from, for example, host 120. Each read command has an address and may also have other information such as a tag. A FIFO 206 is used to store the address and tag of read commands issued by the memory controller 102. In an embodiment, the read CMD scheduler 110 places the information for each read command onto the FIFO 206 in the same order as the read commands are issued to the memory device 106. In an embodiment that uses the FIFO 206, the memory device 106 returns the data for the read commands in the same order as the read commands are issued to the memory device 106. When the memory device returns the data for a read command the address/tag for that read command are obtained from the FIFO 206 and combined with the data. The memory controller 102 may then return the data with the address/tag to, for example, the host 120. Further details of operating an embodiment of the memory controller of FIG. 3A are described below.

Figure 3B:
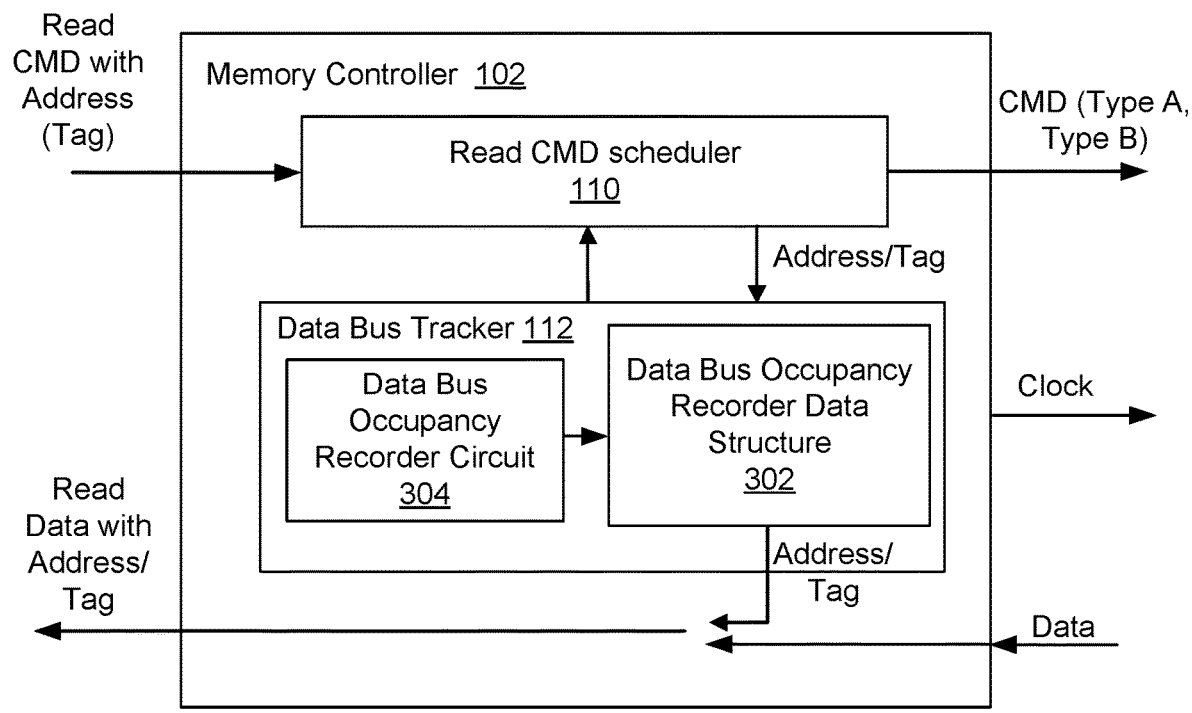
FIG. 3B depicts one embodiment of the memory controller that allows for out-of-order data return from the memory device.

FIG. 3B depicts one embodiment of the memory controller 102 that allows for out-of-order data return from the memory device 106. The data bus tracker 112 has a data bus occupancy recorder data structure 302 (more briefly "occupancy recorder") that stores information regarding the expected usage of the data bus. In an embodiment, the occupancy record 302 contains, for each of a number of future clock cycles (or time slots), whether or not the data bus is projected to be occupied with data returned from the memory device 106. The data bus occupancy recorder circuit 304 updates the information in the occupancy record 302. In an embodiment, whenever a new read command is issued the recorder circuit 304 determines the clock cycles for which the bus will be occupied based on the data out latency and read cycles of the newly issued read command. The recorder circuit 304 may also add information such as the address and tag to the occupancy record 302. The occupancy record 302 may facilitate out-of-order data return from the memory device 106. Further details of operating an embodiment of the memory controller of FIG. 3B are described below.

Figure 4:
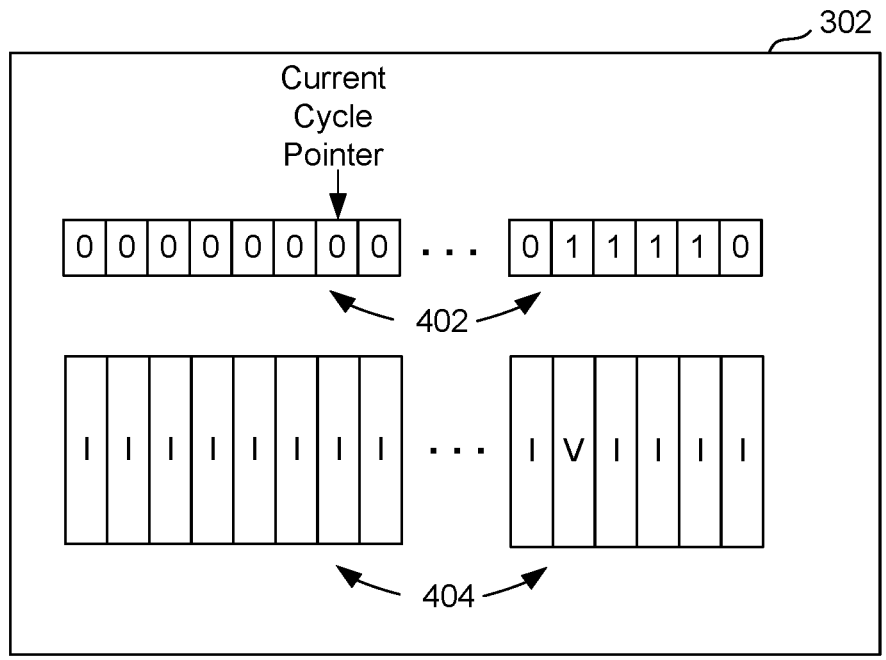
FIG. 4 shows further details for one embodiment of a recorder data structure in the memory controller.

FIG. 4 shows further details for one embodiment of the occupancy record 302. The occupancy record 302 has a circular buffer referred to as an occupation vector 402. Each entry in the occupation vector 402 corresponds to one clock cycle (or time slot). The current cycle pointer points to the entry for the current clock cycle. The current cycle pointer will advance to the right each clock cycle until the end of the occupation vector 402 is reached, in which case, the occupation vector 402 wraps around to the left end of the occupation vector 402. A value of "1" in an entry indicates that the data bus will be occupied for that clock cycle. A value of "0" in an entry indicates that the data bus will not be occupied for that clock cycle. Details of updating the occupation vector 402 are described below. The occupancy record 302 has an address/tag vector 404. Each entry in the address/tag vector 404 is for one clock cycle and corresponds to one entry in the occupation vector 402. Each entry in the address/tag vector 404 either contains valid data (V) or does not contain valid data (I). The valid data may include an address and tag for the read command for which data will occupy the data bus that clock cycle. Therefore, the address and tag may correctly be associated with the returned data, even if the data is returned from the memory device 106 out of order.

Figure 5:
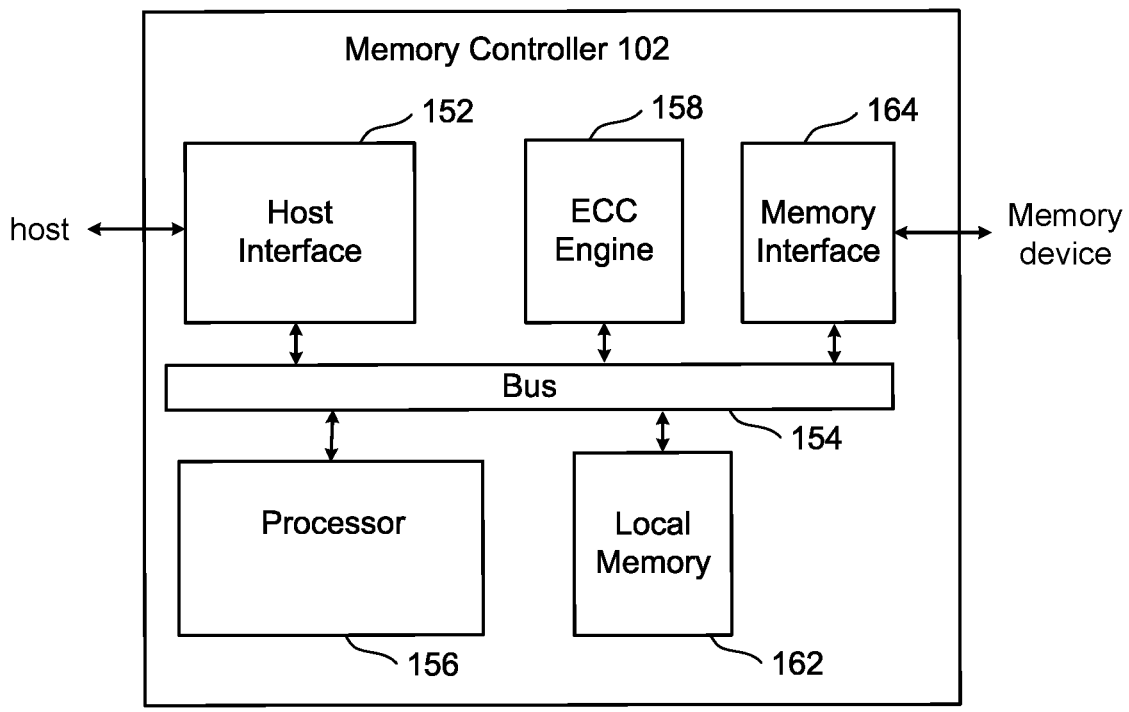
FIG. 5 shows further details of one embodiment of the memory controller.

FIG. 5 shows further details of one embodiment of a memory controller 102. The components of memory controller 102 depicted in FIG. 5 are electrical circuits. The memory controller 102 has host interface 152, processor 156, ECC engine 158, memory interface 164, and local memory 162. The host interface 152 is connected to and in communication with host. Host interface 152 is also connected to a bus 154. In one embodiment, the bus comprises a network-on-chip (NOC). A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. Connected to and in communication with bus 154 is processor 156, ECC engine 158, and memory interface 164.

ECC engine 158 performs error correction services. For example, ECC engine 158 performs data encoding and decoding. The ECC engine may encode data to be written to the memory device 106 as ECC codewords. The ECC engine 158 may decode those ECC codewords when they are read from the memory device 106. In one embodiment, ECC engine 158 is an electrical circuit programmed by software. For example, ECC engine 158 can be a processor that can be programmed. In other embodiments, ECC engine 158 is a custom and dedicated hardware circuit without any software. In one embodiment, the function of ECC engine 158 is implemented by processor 156.

Processor 156 may perform the various controller memory operations, such as reading, programming, erasing, and memory management processes including wear level. In an embodiment, processor 156 schedules and issues read commands to the memory device 106. The processor 156 may determine whether to issue a Read Type A or a Read Type B for each read command. The processor 156 may mix the issuance of Read Type A and Read Type B commands. In one embodiment, processor 156 is programmed by firmware. In other embodiments, processor 156 is a custom and dedicated hardware circuit without any software. Processor 156 may also implements a translation module, as a software/firmware process or as a dedicated hardware circuit. In many systems, the memory on the memory device(s) is addressed internally to the memory system 100 using physical addresses associated with the one or more memory devices. However, the host system may use logical addresses to address the various memory locations. This enables the host to assign data to consecutive logical addresses, while the storage system is free to store the data as it wishes among the locations of the one or more memory device. To implement this system, memory controller 102 (e.g., the translation module) performs address translation between the logical addresses used by the host and the physical addresses used by the memory devices. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 162 cannot hold all of the L2P tables. In such a case, the entire set of L2P tables are stored in a memory 104 and a subset of the L2P tables are cached (L2P cache) in the local memory 162. Memory interface 164 communicates with memory device 106.

As noted above, the read command scheduler 110 and data bus tracker 112 may be implemented in hardware, software (e.g., firmware) or a combination of hardware and software. In some embodiments, the processor 156 implements at least a portion of the read command scheduler 110 and data bus tracker 112. In an embodiment, the local memory 162 is used to store the FIFO 206, occupancy record 302, and other information used by the data bus tracker 112 and/or read CMD scheduler 110. The local memory 162 may be volatile or non-volatile memory. In some embodiments, the local memory 162 is external to the memory controller 102.

Figure 6:
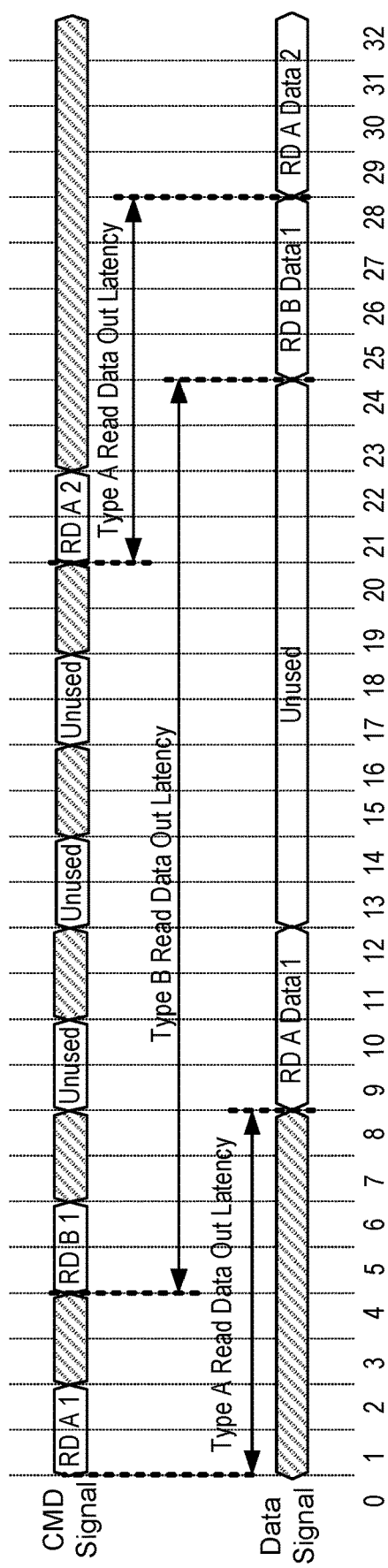
FIG. 6 depicts a timing diagram of a command (CMD) signal and a data signal for one embodiment of memory system.

FIG. 6 depicts a timing diagram of a command (CMD) signal and a data signal for one embodiment of memory system 100. The example in FIG. 6 is for in-order data return. The CMD signal shows three read commands being issued over time. One type of read command is referred to herein as Read Type A (RD A). Another type of read command is referred to herein as Read Type B (RD B). The data out latency of Read Type A is shorter than the data out latency of Read Type B. In an embodiment, the memory device 106 takes longer to perform a Read Type B than a Read Type A. As noted above, an example of the Read Type A is a globally-referenced read and an example of the Read Type B is a self-referenced read. The self-referenced read may be a destructive self-referenced read.

Figure 7:
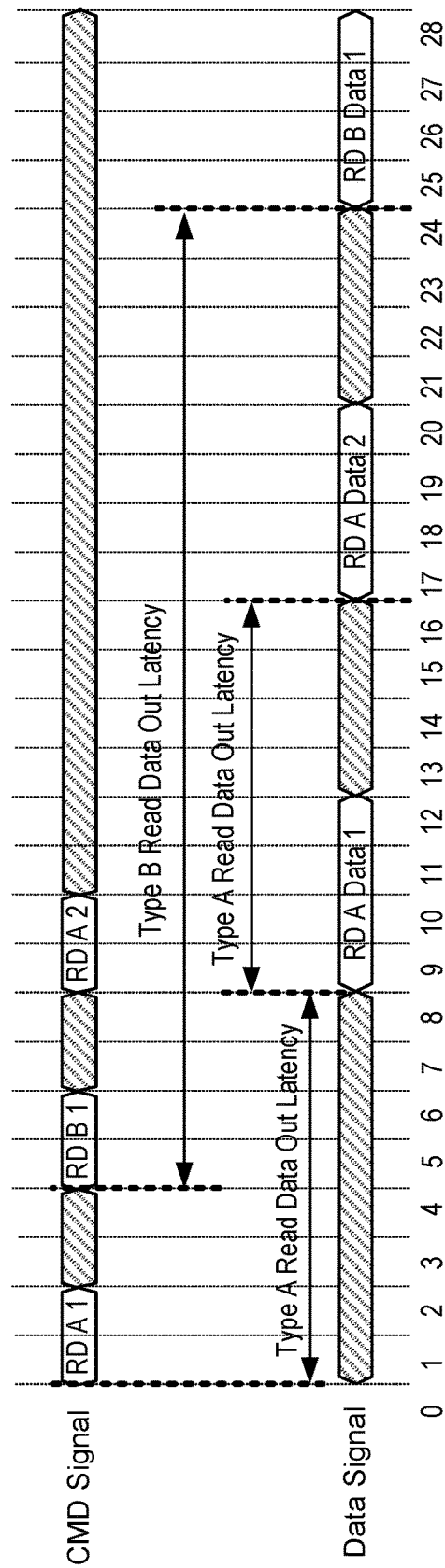
FIG. 7 depicts a timing diagram of a command (CMD) signal and a data signal for one embodiment of memory system that allows for out-of-order data return from the memory device.

FIG. 7 depicts a timing diagram of a command (CMD) signal and a data signal for one embodiment of memory system 100. The CMD signal shows three read commands being issued over time. The example in FIG. 7 permits out-of-order data return. Note that although RD A 2 is issued after RD B1, the data for RD A 2 is returned prior to the data for RD B 1.

Figure 8:
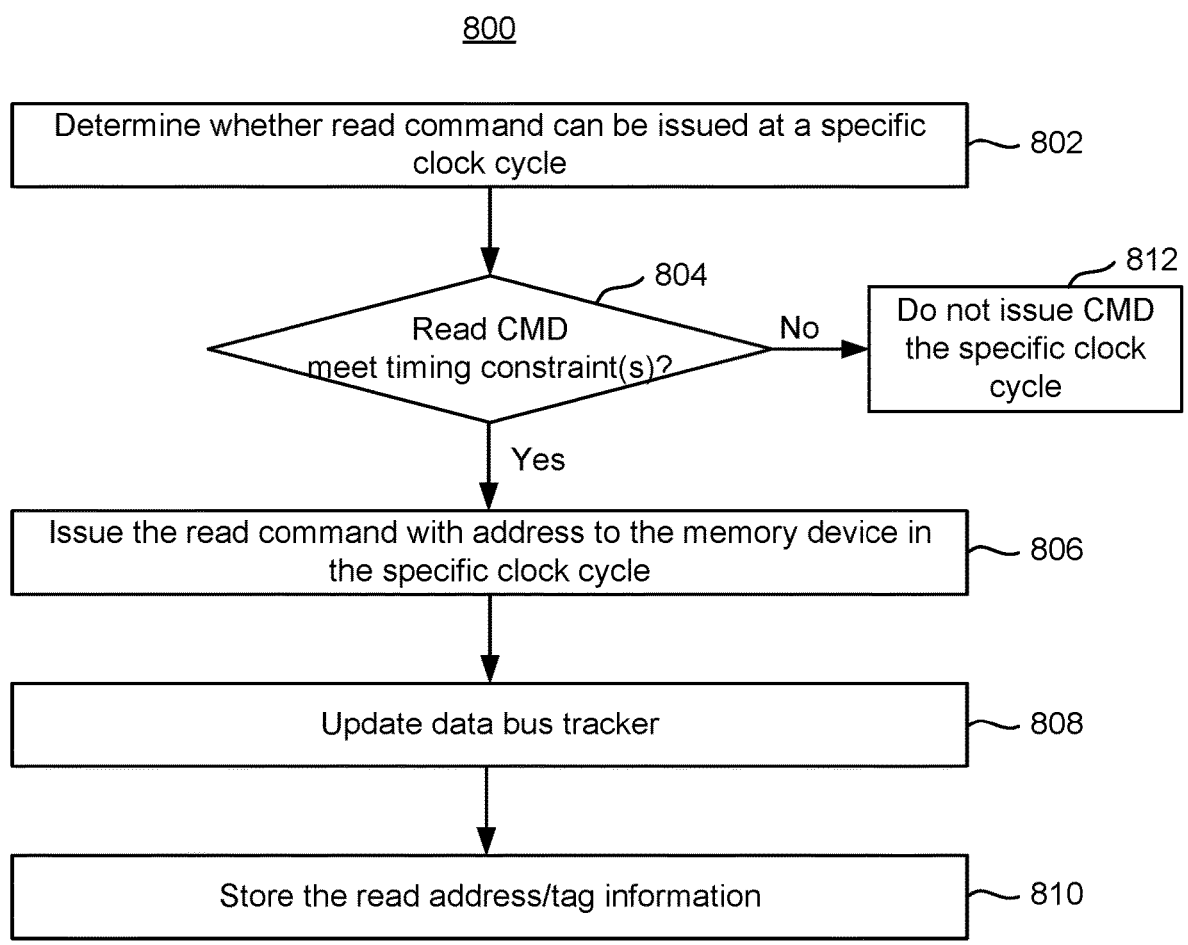
FIG. 8 is a flowchart of one embodiment of a process of controlling reads to the memory device.

FIG. 8 is a flowchart of one embodiment of a process 800 of controlling reads to a memory device. The process 800 may be performed by any of the memory controllers in FIG. 2, FIG. 3A, FIG. 3B, and/or FIG. 5 but is not limited thereto. The process 800 describes the memory controller 102 determining whether a particular read command can be issued to the memory device 106 during a specific clock cycle. Step 802 includes a determination of whether the read command can be issued at the specific clock cycle. In one embodiment, the read CMD scheduler 110 in FIG. 3A makes this determination based on the countdown timer 202 and the data out latency of this read command. In one embodiment, the read CMD scheduler 110 in FIG. 3B makes this determination based on the occupancy record 302, the data out latency, and the read cycles of this read command. Further details of embodiments of step 802 are discussed below. Step 804 is a decision based on the determination of step 802. Step 804 is thus a determination of whether the read command meets one or more timing constraints. The one or more timing constraints may include a constraint that issuing the read command will not result in a data collision of the data bus. In an embodiment, the one or more timing constraints include a constraint that the data will be returned in order. However, in an embodiment, out of order data return is permitted.

If the read command meets the one or more timing constraints then in step 806 the read command is issued during the specific clock cycle. The address is also provided to the memory device 106. Step 808 includes updating the data bus tracker 112. In one embodiment, the countdown timer 202 (see FIG. 3A) is reset to the such of the data out latency and read data cycles of the read command just issued. In one embodiment, the appropriate entries in the occupation vector 402 (see FIG. 4) are set to "1" to indicate the time slots for which the data bus is projected to be occupied with returned data for this read command.

Step 810 includes storing the read address and tag information for the read command. In one embodiment, the read address and tag are stored in the FIFO 206 (see FIG. 3A). In one embodiment, the read address and tag are stored in the address/tag vector 404 (see FIG. 4).

Returning again to the discussion of step 804, if the read command does not meet the one or more timing constants, then the read command is not issued in the specific clock cycle (step 812). The memory controller 102 may determine a suitable clock cycle that the read command may be issued in. If so, then steps 806-810 may be performed for the suitable clock cycle.

FIG. 9 is a flowchart of one embodiment of a process 900 of controlling issuance of read commands to a memory device. The process 900 is one embodiment of in-order processing in which the memory device 106 returns the data in the same order as the read commands were issued to the memory device 106. In one embodiment, the memory controller 102 of FIG. 3A performs process 900. However process 900 is not limited to being performed by the memory controller 102 of FIG. 3A. With reference to FIG. 3A the data bus tracker 112 maintains a countdown timer 202. As discussed above, the countdown timer 202 may indicate the earliest time slot at which the data is permitted to be returned on the data bus, while maintaining an in order data return. Thus, in an embodiment, the memory controller 102 performs process 900 to ensure in order data return.

Step 902 includes accessing the countdown timer 202 for this particular clock cycle. Step 904 includes a determination of whether the data out latency for this type of read command is greater than or equal to the value of the countdown timer 202. FIG. 10A shows an example timing diagram that will be discussed to illustrate step 902. FIG. 10A shows an example in which the current cycle is the start of cycle 12. At this point in time the countdown timer 202 (Data Out Countdown Timer) has a value of 17, such that the earliest data out for the next read is cycle 29. An example will be discussed in which the read command under analysis is a read type A and has a data out latency of eight clock cycles. Because the data out latency is not greater than or equal to the countdown timer the read type A will not be issued at the current cycle of 12. Therefore, at step 906 of FIG. 9 the read command is not issued. Step 908 includes decrementing the countdown timer 202. Note that the countdown timer 202 may be decremented by one each idle clock cycle (i.e., each clock cycle that a read command is not issued). However, the countdown timer 202 is not decremented to a negative number. For the sake of illustration, the countdown timer 202 may be decremented in this manner a number of times until the read command of Type A may be issued. Because the countdown timer 202 is decremented once each idle cycle the earliest data out for the next read will remain at cycle 29. However, at cycle 21 that countdown timer 202 will have decremented to eight. Therefore, the read command of Type A with a data out latency of eight cycles may be issued in cycle 21. Step 910 may thus be performed to issue the read command. Step 912 includes updating the countdown timer 202 based on the read type. In this example, the countdown timer 202 will be set to the sum of the data out latency and read cycles of the type of read command plus the read cycles. In the present example, the countdown timer 202 is data out latency is eight cycles and the read cycles is four cycles. Therefore, the countdown timer 202 is set to 12. FIG. 10B depicts the timing diagram when the current cycle is 21. The read command (RD A 2) has been issued at cycle 21. The countdown timer has been set to 12 and points to cycle 33 as the new earliest data out for the next read. Step 914 includes pushing the address and tag for the read command onto the FIFO 206. Although the foregoing example was of a read type A, a similar process can be performed for a read type B having a greater latency.

Figure 11:
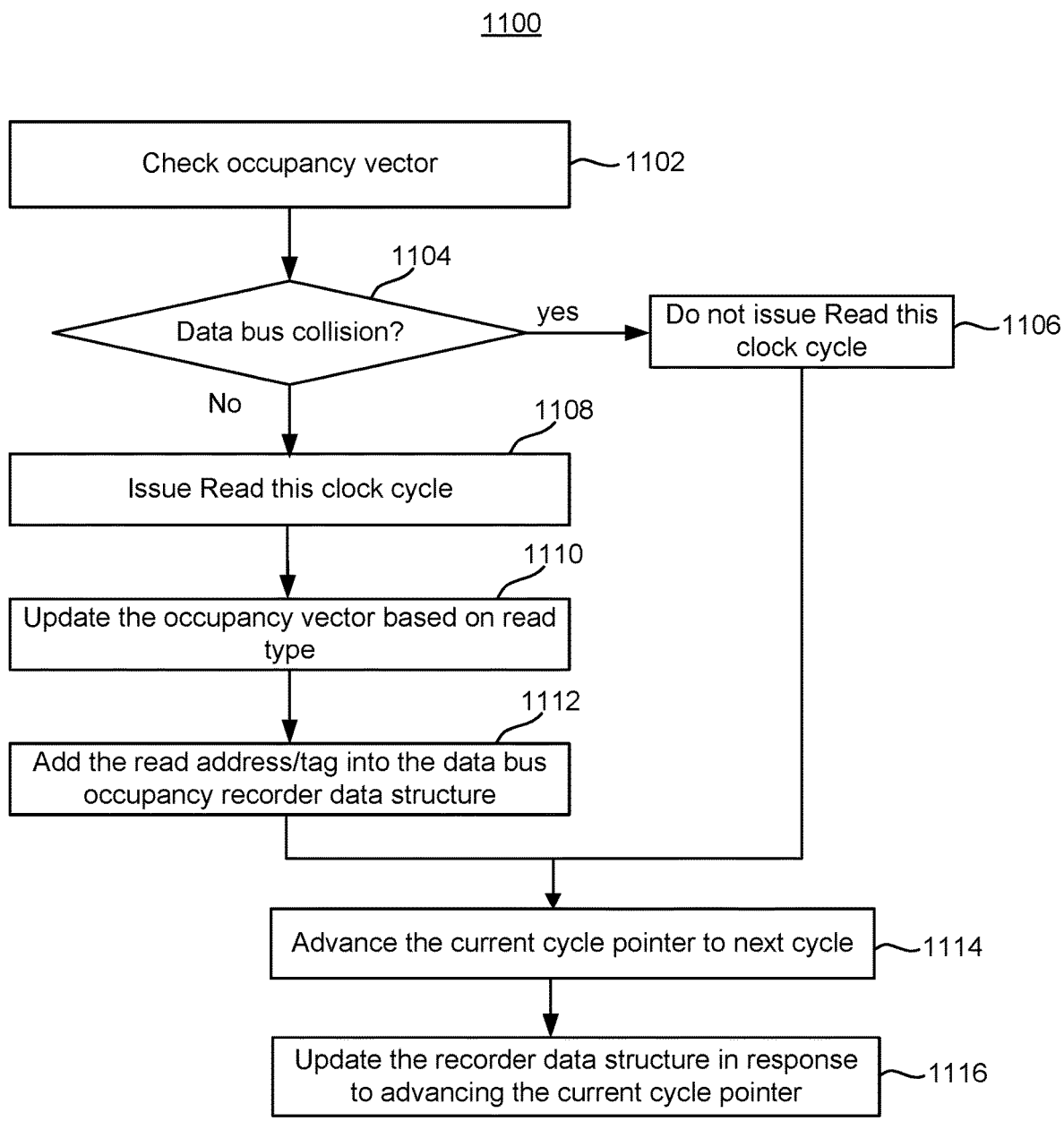
FIG. 11 is a flowchart of one embodiment of a process of controlling issuance of read commands to the memory device in which data is returned in order.

FIG. 11 is a flowchart of one embodiment of a process 1100 of controlling issuance of read commands to a memory device. The process 1100 is one embodiment of out-of-order processing in which the memory device 106 may return the data in a different order that the read commands were issued to the memory device 106. In one embodiment, the memory controller 102 of FIG. 3B performs process 1100. However process 1100 is not limited to being performed by the memory controller 102 of FIG. 3B. With reference to FIG. 3B the data bus tracker 112 maintains an occupancy record 302. With reference to FIG. 4 the occupancy record 302 may have an occupancy vector 402. As discussed above, the occupancy vector 402 may indicate the time slots for which the data bus is projected (or expected) to contain data being returned by the memory device 106.

Process 1100 will be discussed with respect to determining whether to issue a read command a particular type for a current clock cycle. FIG. 12A and FIG. 12B will be referred to illustrate an initial condition. FIG. 12A is a timing diagram for an example in which a read type A was issued at cycle 1 and a read type B was issued at cycle 5. Those two commands are referred to as RD A 1 and RD B 1, respectively. The current cycle is cycle 9. For purpose of discussion, a determination is to be made whether a read type A command may be issued at cycle 9. FIG. 12B depicts an embodiment of an occupancy record 302 that is consistent with the timing diagram of FIG. 12A. The entry that is pointed to by the current cycle pointer corresponds to clock cycle 9. The occupancy vector 402 has four entries with a "1" starting at the current cycle pointer to represent the return of the data for RD A 1. Those four entries correspond to time slots 9-12 (see FIG. 12A). There are also four entries with a "1" to represent the return of the data for RD B 1. Those four entries correspond to time slots 25-28 (see FIG. 12A).

Figure 13A:
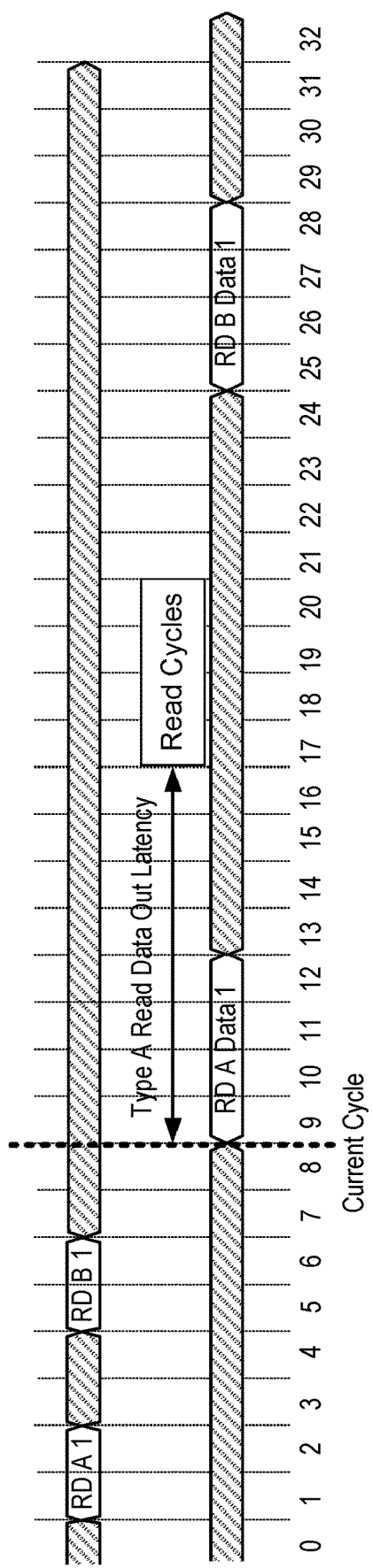
FIG. 13A is a timing diagram consistent with the in-order data return example of FIG. 12A.
Figure 13B:
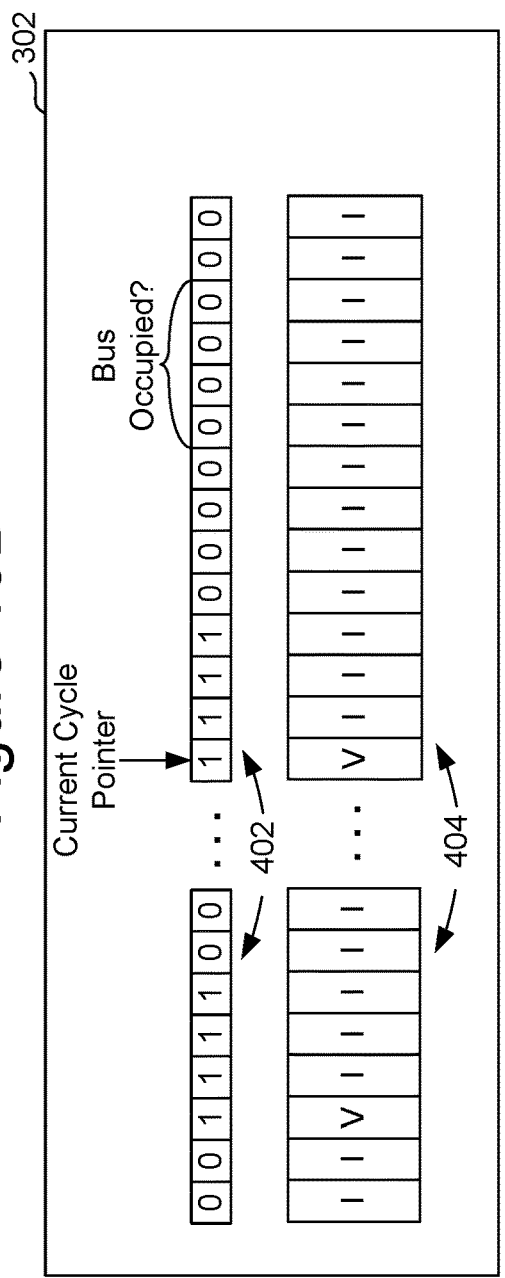
FIG. 13B depicts an embodiment of a data bus occupancy recorder data structure that is consistent with the timing diagram of FIG. 13A.

Step 1102 in FIG. 11 includes accessing the occupancy vector 402. As noted there is a current cycle pointer that points to one of the entries in the occupancy vector 402. Step 1104 includes a determination of whether there will be a data bus collision if the read command were to be issued at the current clock cycle. FIGS. 13A and 13B will be referred to illustrate an embodiment of step 1104. FIG. 13A is a timing diagram consistent with the example of FIG. 12A in which the current cycle is also at cycle 9. FIG. 13A shows that the data for the potential new read command is projected to be returned during cycles 17-20. This determination adds the data out latency of the Type A read to the current cycle. FIG. 13B shows four entries in the occupancy vector 402 labeled "Bus Occupied?" These four entries correspond to cycles 17-20 (see FIG. 13A). All four entries are "0" indicating that the data bus is not presently projected to have data during any of cycles 17-21. Therefore, the new read command may be issued in cycle 9.

Figure 14A:
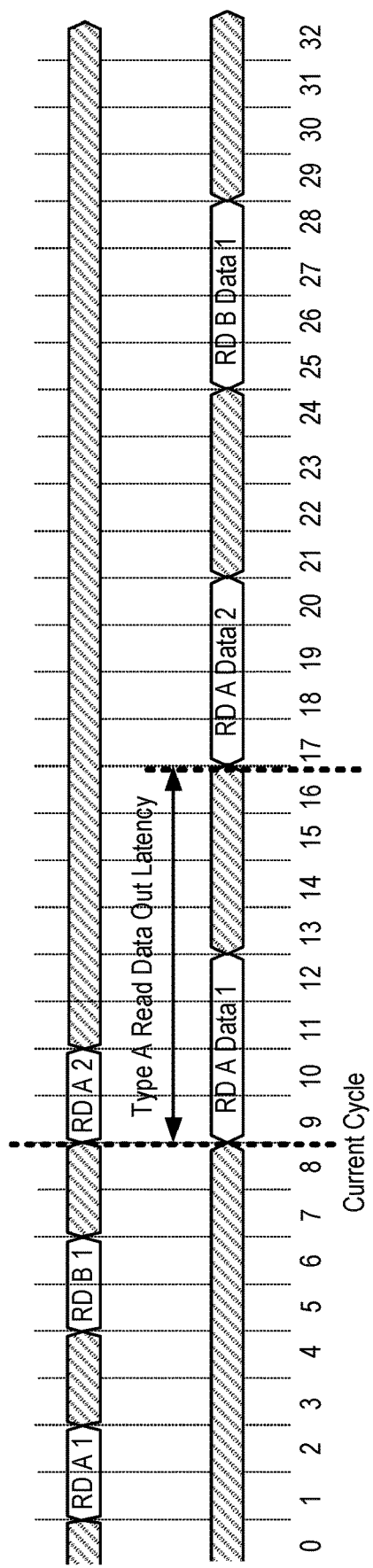
FIG. 14A is a timing diagram consistent with the in-order data return example of FIG. 13A.
Figure 14B:
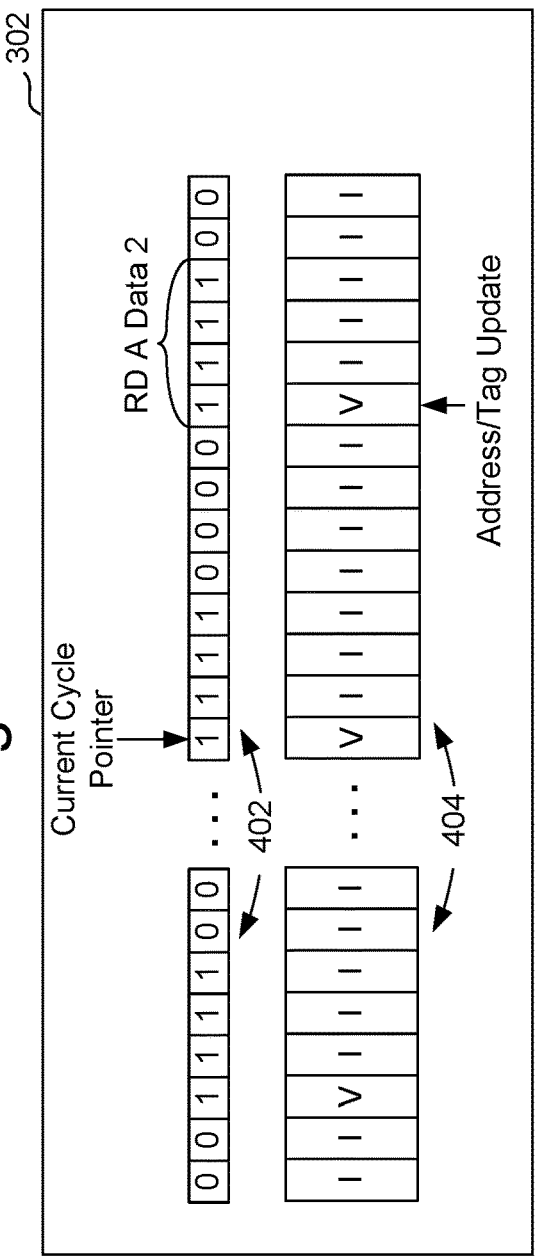
FIG. 14B depicts an embodiment of a data bus occupancy recorder data structure that is consistent with the timing diagram of FIG. 14A.

Referring again to the discussion of FIG. 11, the read command is issued in step 1108. Step 1110 includes updating the occupancy vector 402 in view of the read command just issued. FIGS. 14A and 14B will be referred to illustrate an embodiment of step 1110. FIG. 14A is a timing diagram consistent with the example of FIG. 13A in which the current cycle is also at cycle 9. However, FIG. 14A shows that RD A 2 has been issued on the command interface at cycle 9. The data interface shows RD A Data 2 at cycles 17-20 to reflect when the data from RD A 2 is projected to be returned on the data bus. FIG. 14B depicts updating the occupancy vector 402. The entries of the occupancy vector 402 labeled "RD A Data 2" have all been set to "1" to record the projected data bus occupancy. These four entries correspond to cycles 17-21 (see FIG. 14A).

Referring again to the discussion of FIG. 11, in step 1112 the read address/tag information is added to in the occupancy record 302. FIG. 14B shows an update made relative to FIG. 13B. The "I" has been changed to a "V" in the entry pointed to by "Address/Tag update" to indicate that the address and tag for this newly issued read command has been added to the occupancy record 302. Note that this entry corresponds to cycle 17, which is the first cycle for RD A Data 2. Therefore, the address and tag have been linked to the return of the data for the new read command (RD A 2). Furthermore, note that the data for RD A 2 is to be returned prior to the data for RD B1, which was issued earlier. Therefore, the occupancy record 302 facilities out-of-order data return.

Figure 15A:
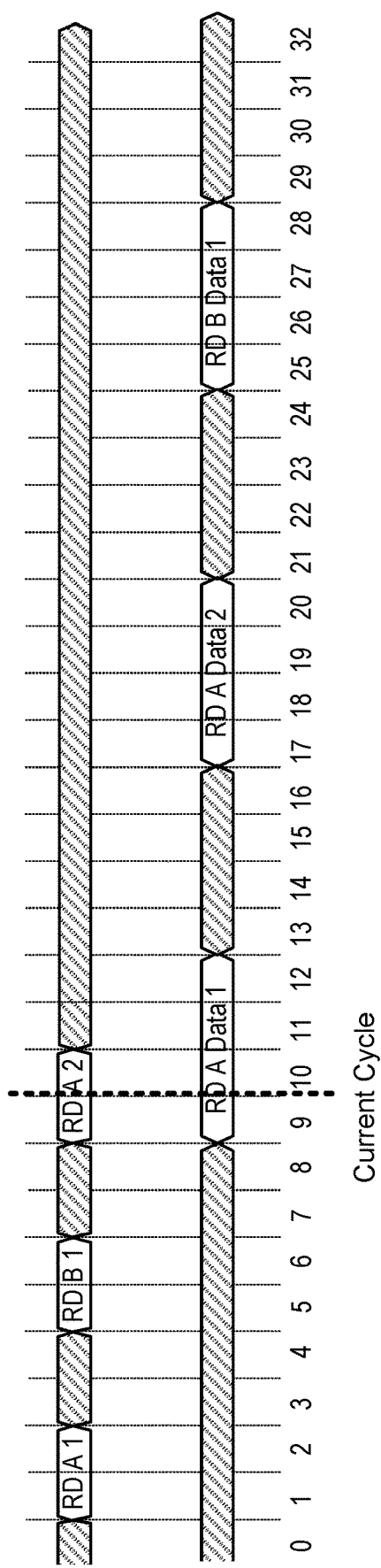
FIG. 15A is a timing diagram of the consistent with the in-order data return example of FIG. 14A.
Figure 15B:
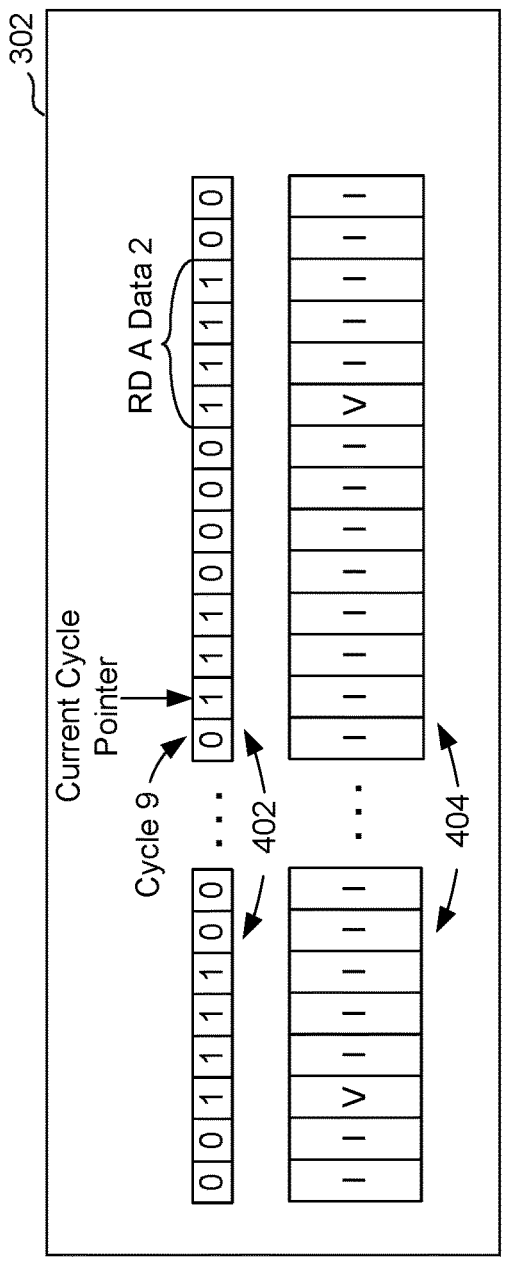
FIG. 15B depicts an embodiment of a data bus occupancy recorder data structure that is consistent with the timing diagram of FIG. 15A.

Referring again to the discussion of FIG. 11, in step 1114 the current cycle pointer is advanced to the next cycle. In step 1116, the occupancy record 302 is updated in response to advancing the current cycle pointer. More specifically, the entries for what was the current cycle are updated when advancing the pointer to the next cycle. FIGS. 15A and 15B will be referred to illustrate an embodiment of step 1116. FIG. 15A is a timing diagram of the present example but with the current cycle now at cycle 10. FIG. 15B depicts updates made to the occupancy record 302 in response to advancing to cycle 10. The current cycle pointer in FIG. 15B has been advanced one entry relative to the example in FIG. 14B. Moreover, the entry for what is now the previous cycle (cycle 9) has been changed from "1" to "0". Furthermore, the address/tag vector 404 for cycle 9 has been changed from "V" to "I". Note that the address/tag information that was in the entry for cycle 9 is copied out such that it may be used when returning the data for RD A 1.

Returning again to the discussion of FIG. 11 in some cases the determination in step 1104 may that there would be a data bus collision if the read command were to be issued in the current cycle. In this case, step 1106 indicates that the read is not issued this clock cycle. After step 1106 the current cycle pointer is advanced in step 1114. As discussed above, the occupancy record 302 is updated in step 1116 in response to advancing the current cycle pointer.

Figure 16:
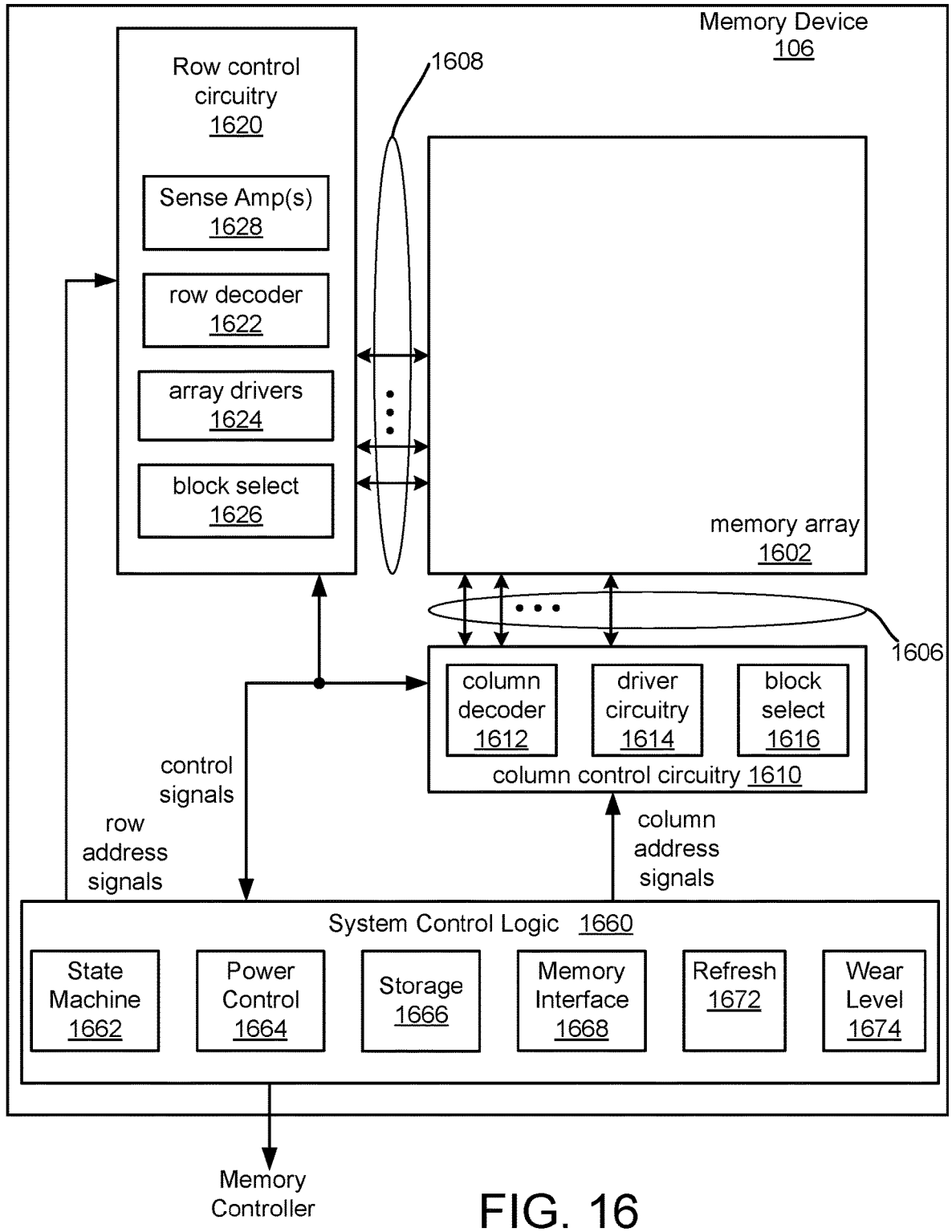
FIG. 16 is a block diagram that depicts one example of a memory device that can perform multiple types of reads.

FIG. 16 is a block diagram that depicts one example of a memory device 106 that can perform multiple types of reads. In one embodiment, the memory device 106 is formed on a semiconductor die and could be referred to as a memory die. Memory device 106 includes a memory array 1602 that can include any of memory cells described in the following. The memory cells 140 (see FIG. 2) may reside in memory array 1602. The array terminal lines of memory array 1602 include the various layer(s) of word lines organized as rows, and the various layer(s) of bit lines organized as columns. However, other orientations can also be implemented. Memory device 106 includes row control circuitry 1620, whose outputs 1608 are connected to respective word lines of the memory array 1602. Row control circuitry 1620 receives a group of M row address signals and one or more various control signals from System Control Logic circuit 1660, and typically may include such circuits as row decoders 1622, row drivers 1624, and block select circuitry 1626 for both reading and writing operations. Row control circuitry 1620 may also include read/write circuitry. In an embodiment, row decode and control circuitry 1620 has sense amplifiers 1628, which each contain circuitry for sensing a condition (e.g., voltage) of a word line of the memory array 1602. In an embodiment, by sensing a word line voltage, a condition of a memory cell in a cross-point array is determined. Memory device 106 also includes column decode and control circuitry 1610 whose input/outputs 1606 are connected to respective bit lines of the memory array 1602. Although only a single block is shown for memory array 1602, a memory device can include multiple arrays or "tiles" that can be individually accessed. In some embodiments, a group of memory cells that store an ECC codeword are read together. In some cases, a single memory cell in a tile is read such that many tiles are read in parallel to read the ECC codeword. In some embodiments, it is possible to read more than one cell in a tile simultaneously. In some embodiments one type of read may be performed for one group of cells while a different type of read may be performed for a different group of cells. For example, a globally-referenced read may be performed for one group that stores an ECC codeword while a self-referenced read is performed in a different group that stores a different ECC codeword. Column control circuitry 1610 receives a group of N column address signals and one or more various control signals from System Control Logic 1660, and typically may include such circuits as column decoders 1612, column decoders and drivers 1614, block select circuitry 1616, as well as read/write circuitry, and I/O multiplexers.

System control logic 1660 receives data and commands from the memory controller 102 and provides output data and status to the memory controller 102. In some embodiments, the system control logic 1660 can include a state machine 1662 that provides die-level control of memory operations. In some embodiment, the state machine 1662 controls the overall flow of the globally-referenced read and the self-referenced read. In one embodiment, the state machine 1662 is programmable by software. In other embodiments, the state machine 1662 does not use software and is completely implemented in hardware (e.g., electrical circuits). In another embodiment, the state machine 1662 is replaced by a micro-controller or microprocessor. The system control logic 1660 can also include a power control module 1664 that controls the power, current source currents, and voltages supplied to the rows and columns of the memory array 1602 during memory operations and may include charge pumps and regulator circuit for creating regulating voltages, and on/off control of each for word line bit line selection of the memory cells. System control logic 1660 includes storage 1666, which may be used to store parameters for operating the memory array 1602. System control logic 1660 also includes refresh logic 1672 and wear leveling logic 1674. Such system control logic may be commanded by the host 120 or memory controller 102 to refresh logic 1672, which may load an on-chip stored row and column address (Pointer) which may be incremented after refresh.

Commands and data are transferred between the memory controller 102 and the memory device 106 via memory controller interface 1668 (also referred to as a "communication interface"). Such interface may be PCIe, CXL, DDRn for example. Memory controller interface 1668 is an electrical interface for communicating with memory controller 102. Examples of memory controller interface 1668 also include a Toggle Mode Interface. Other I/O interfaces can also be used. In one embodiment, memory controller interface 1668 includes a set of input and/or output (I/O) pins that connect to the memory controller 102. In another embodiment, the interface is JEDEC standard DDRn or LPDDRn, such as DDR5 or LPDDR5, or a subset thereof with smaller page and/or relaxed timing.

In one embodiment, memory array 1602 comprises a three-dimensional memory array of non-volatile or volatile memory cells in which multiple memory levels are formed above a single substrate, such as a wafer. The memory structure may comprise any type of non-volatile or volatile memory that are monolithically formed in one or more physical levels of memory cells having an active area disposed above a silicon (or other type of) substrate. In another embodiment, memory array 1602 comprises a two-dimensional memory array of non-volatile memory cells.

The exact type of memory array architecture or memory cell included in memory array 1602 is not limited to the examples above. Many different types of memory array architectures or memory technologies can be used to form memory array 1602. No particular non-volatile memory technology is required for purposes of the new claimed embodiments proposed herein. Other examples of suitable technologies for memory cells of the memory structure 1602 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 1602 include two dimensional arrays, three dimensional arrays, cross-point arrays, stacked two dimensional arrays, vertical bit line arrays, and the like.

One example of a ReRAM or MRAM cross-point memory includes programmable resistance switching elements in series with and OTS selector arranged in cross-point arrays accessed by X lines and Y lines (e.g., word lines and bit lines). In another embodiment of cross-point is PCM in series with and OTS selector. In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data using magnetic storage elements. The elements are formed from two ferromagnetic layers, each of which can hold a magnetization, separated by a thin insulating layer. For a field-controlled MRAM, one of the two layers is a permanent magnet set to a particular polarity; the other layer's magnetization can be changed by applying an external field to store memory. Other types of MRAM cells are possible. A memory device may be built from a grid of MRAM cells. In one embodiment for programming, each memory cell lies between a pair of write lines arranged at right angles to each other, parallel to the cell, one above and one below the cell. For some MRAM cells, when current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). The memory cells are programmed by current pulses that can change the co-ordination of the PCM material or switch it between amorphous and crystalline states. Note that the use of "pulse" in this document does not require a square pulse but includes a (continuous or non-continuous) vibration or burst of sound, current, voltage light, or other wave. And the current forced for write can, for example, be driven rapidly to a peak value and then linearly ramped lower with, for example, a 200 ns edge rate. Such peak current force may be limited by a zoned voltage compliance that varies by position of the memory cell along the word line or bit line. In an embodiment, a phase change memory cell has a phase change memory element in series with a threshold switching selector such as an OTS.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

For purposes of this document, the phrase "a control circuit" can include, but is not limited to, one or more of memory controller 102, read command scheduler 110, data bus tracker 112, circuit for performing read type A 150, circuit for performing read type B 160, processor 156, memory interface 164, common read circuitry 170, system control logic 1660, column control circuitry 1610, row control circuitry 1620, a micro-controller, a state machine, and/or other control circuitry, or other analogous circuits that are used to control volatile or non-volatile memory. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the phrase "read circuitry" can include, but is not limited to, one or more of: circuit for performing read type A 150, circuit for performing read type B 160, common read circuitry 170, system control logic 1660, column control circuitry 1610, row control circuitry 1620, a micro-controller, a state machine, and/or other control circuitry, or other analogous circuits that are used to read volatile or non-volatile memory. The read circuitry can include hardware only or a combination of hardware and software (including firmware). Read circuitry can include a processor, FPGA, ASIC, integrated circuit, or other type of circuit. In an embodiment, the read circuitry is configured to read memory cells. In an embodiment, the memory cells comprise magnetoresistive random access memory (MRAM) cells. In an embodiment, the read circuitry is configured to perform a first type of read having a first performance time and a second type of read having a second performance time that is longer than the first performance time. In an embodiment the first type of read comprises a globally-referenced read and the second type of read comprises a self-referenced read (SRR).

For purposes of this document, the term "apparatus" can include, but is not limited to, one or more of memory system 100, memory controller 102, the combination of memory system 100 and host system 120, etc.

Figure 17:
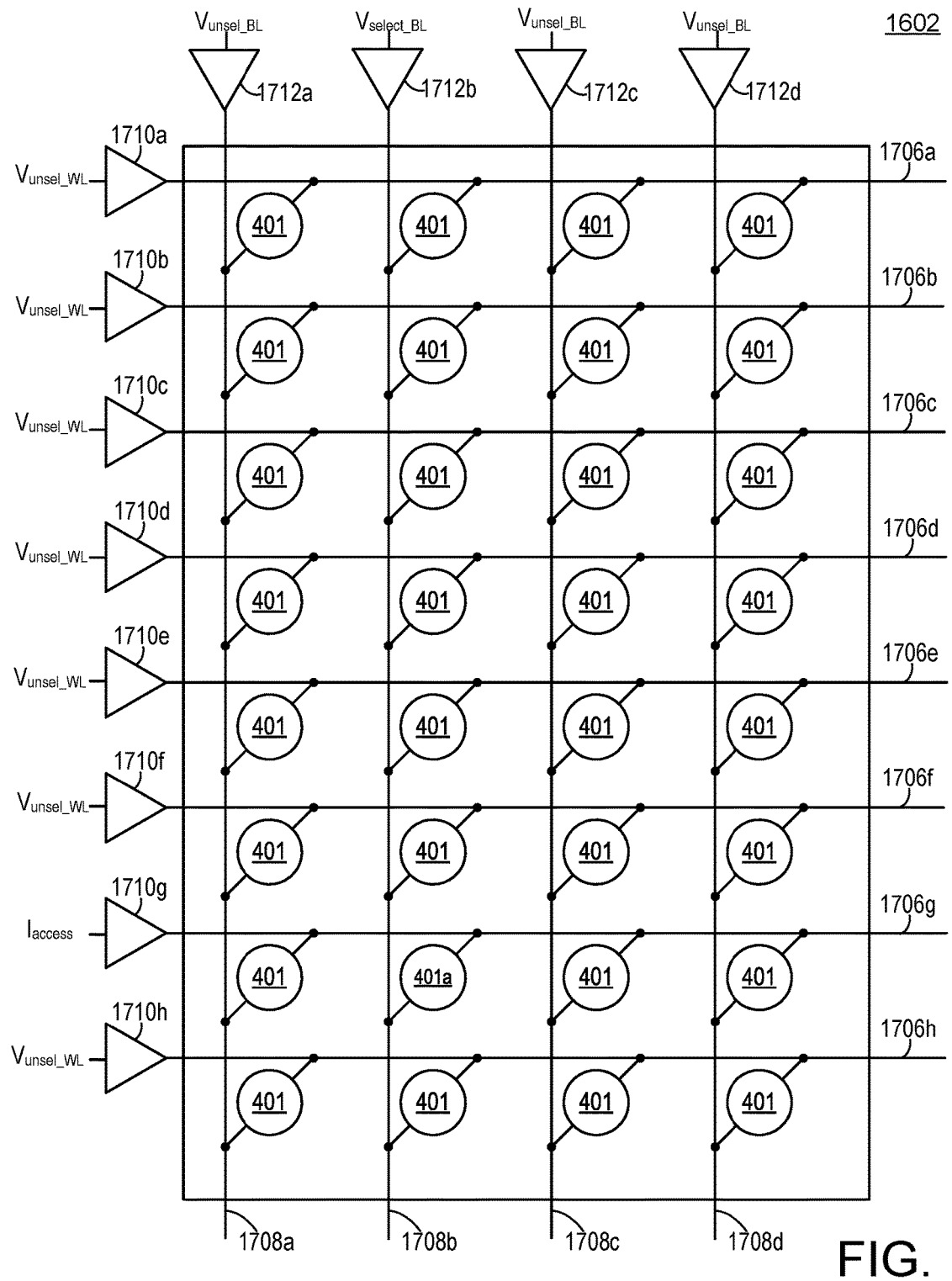
FIG. 17 depicts an embodiment of a memory array having a cross-point architecture.

In some embodiments, the memory array 1602 has a cross-point architecture. FIG. 17 depicts an embodiment of a memory array 1602 having a cross-point architecture. The memory array 1602 has a set of first conductive lines 1706a-1706h and a set of second conductive lines 1708a-1708d. In one embodiment, the set of first conductive lines 1706a-1706h are word lines and the set of second conductive lines 1708a-1708b are bit lines. For ease of discussion, the set of first conductive lines 1706a-1706h may be referred to as word lines and the set of second conductive lines 1708a-1708b may be referred to as bit lines. However, the set of first conductive lines 1706a-1706h could be bit lines and the set of second conductive lines 1708a-1708b could be word lines.

The memory array 1602 has a number of programmable resistance memory cells 401. Each memory cell 401 is connected between one of the first conductive lines 1706 and one of the second conductive lines 1708. In one embodiment, each memory cell 401 has a magnetoresistive random access memory (MRAM) element in series with a threshold switching selector element. The threshold switching selector is configured to become conductive with lower resistance in response to application of a voltage level exceeding a threshold voltage of the threshold switching selector, and remains conductive with lower resistance until the current through the switching selector is reduced below the selector holding current, Ihold. In an embodiment, the threshold switching selector element comprises an OTS.

Each first conductive line 1706 may be driven by one of the WL drivers 1710a-1710h. For example, first conductive line 1706a may be driven by WL driver 1710a, first conductive line 1706b may be driven by WL driver 1710b, etc. Each second conductive line 1708 is driven by one of the BL drivers 1712a-1712d. For example, second conductive line 1708a is driven by BL driver 1712a, second conductive line 1708b is driven by BL driver 1712b, etc. In one embodiment, the word lines and the bit lines are driven from one end of the word line or bit line. FIG. 17 depicts such an embodiment in which the word lines and the bit lines are driven from one end. In an alternative embodiment, the bit lines and/or the word lines are driven from a midpoint.

Although a separate driver 1710 is depicted connected to each word line 1706, it is not required to have a separate driver 1710 for each word line. A driver may be connected to the selected word line by decode circuitry that selects the WL 1706 to be driven. However, locations of WL drivers 1710a-1710h in FIG. 17 may still indicate the location (e.g., end) of the word line that is driven.

For purpose of discussion, memory cell 401a is being selected for access. This could be a read or a write access. Selected memory cell 401a is at the cross-point of selected word line 1706g and selected bit line 1708b. To select a memory cell 401, a select voltage ($V_{select\_BL}$) such as near ground is provided to the selected bit line (e.g., bit line 1708b) and an access current ($I_{access}$) may be driven (or forced) through a selected word line (e.g., word line 1706g). The access current may flow between a portion of the selected word line 1706g, through the selected memory cell 401a, and through a portion of the selected bit line 1708b. A selected word line means that that word line is connected to at least one selected memory cell. The selected word line will typically be connected to one or more unselected memory cells. A selected bit line means that that bit line is connected to at least one selected memory cell. The selected bit line will typically be connected to one or more unselected memory cells. A selected memory cell is connected between a selected word line and a selected bit line.

In one embodiment, $V_{select\_BL}$ has a magnitude such that the threshold switching selector in a selected memory cell will turn on, assuming that $I_{access}$ is applied to the selected word line. For example, $V_{select\_BL}$ may be approximately 0V. On the other hand, $V_{unsel\_BL}$ has a magnitude such that the threshold switching selector in an unselected memory cell will not turn on, for example $V_{select\_BL}$ may be approximately 1.65V if the positive power supply is 3.3V. Word line driver 1710g drives an access current ($I_{access}$) through at least a portion of selected word line 1706g. This access current may also flow through the selected memory cell 401a and in a portion of selected bit line 1708b. Such a selected WL may, for example, be driven high by 15 µa to read or 30 µa to write by a current source with compliance voltage of, for example, 3.3V. To write the opposite polarity, the selected word line is forced, for example, with −30 µa and the selected bit line to 3.3V.

The other memory cells are not selected for access (i.e., are unselected memory cells). An unselected memory cell means that the memory cell is not presently selected for access (e.g., read or write). An unselected word line is only connected to unselected memory cells. An unselected bit line is only connected to unselected memory cells. Word lines and bit lines that are not selected are referred to as unselected word lines or unselected bit lines, respectively. In one embodiment, a word lines or bit lines may be unselected by forcing them to an unselect voltage, such as Vmid, for example 1.65V, at approximately one half the drive compliance voltage, for example 3.3V. An unselect voltage ($V_{unsel\_BL}$) is provided to the unselected bit lines (e.g., bit lines 1708a, 1708c, 1708d). An unselect voltage ($V_{unsel\_WL}$) is provided to the unselected word lines (e.g., word lines 1710a, 1710b, 1710c, 1710d, 1710e, 1710f, and 1710h).

The WL drivers 1710 are configured to either source a current or sink a current. Thus, $I_{access}$ could flow in either direction through the selected word line (as well as the selected bit line). By convention used herein, when a current driver 1710 is used as a current source the magnitude of the access current is positive. By convention used herein, when a current driver 1710 is used as a current sink the magnitude of the access current is negative. Whether a current driver 1710 sources or sinks a current, herein this will be referred to as forcing or driving the current to or through the selected word line. In one embodiment, no current other than leakage is forced through unselected word lines (e.g., 1706a, 1706b, 1706c, 1706d, 1706e, 1706f, and 1706h).

In the example of FIG. 17 there are more word lines than bit lines in the cross-point array. In one embodiment, there are more bit lines than word lines in the cross-point array. In one embodiment, the number of bit lines equals the number of word lines in the cross-point array. In the example of FIG. 17 there are twice as many word lines as bit lines in the cross-point array; however, a different ratio could be used. Thereby, different tile sizes may be realized. For example, a tile may have 1024 BL by 2048 WL, which may be composed into a module of 2048×4096 cells by center driving the WL and BL between the four tiles. In one embodiment, SRR is performed on a group of memory cell by, for example, selecting one memory cell in each of a number of tiles. In some embodiments, more than one memory cell from a tile may be selected for SRR.

In some embodiments, a current-force approach is used to access memory cells in a cross-point memory array. Threshold switching selectors may be used in series with the memory cells. The threshold switching selector may be connected in series with the memory element between the word line and the bit line. Hence, any voltage across the switching selector will reduce the voltage across the memory element. Typically, there will be some variation in the offset or hold voltage between the switching selectors. A current-force approach helps to mitigate offset voltage variation between threshold switching selectors to help minimize the selected cell current variation cell to cell. In one embodiment, a voltage-force approach is used to access memory cells in a cross-point memory array. In an embodiment of a voltage-force SRR rather than forcing $I_{access}$ to the selected word line 1706g, a select voltage is applied to the selected word line 1706g, thereby creating a target voltage across the selected memory cell 401a.

Figure 18:
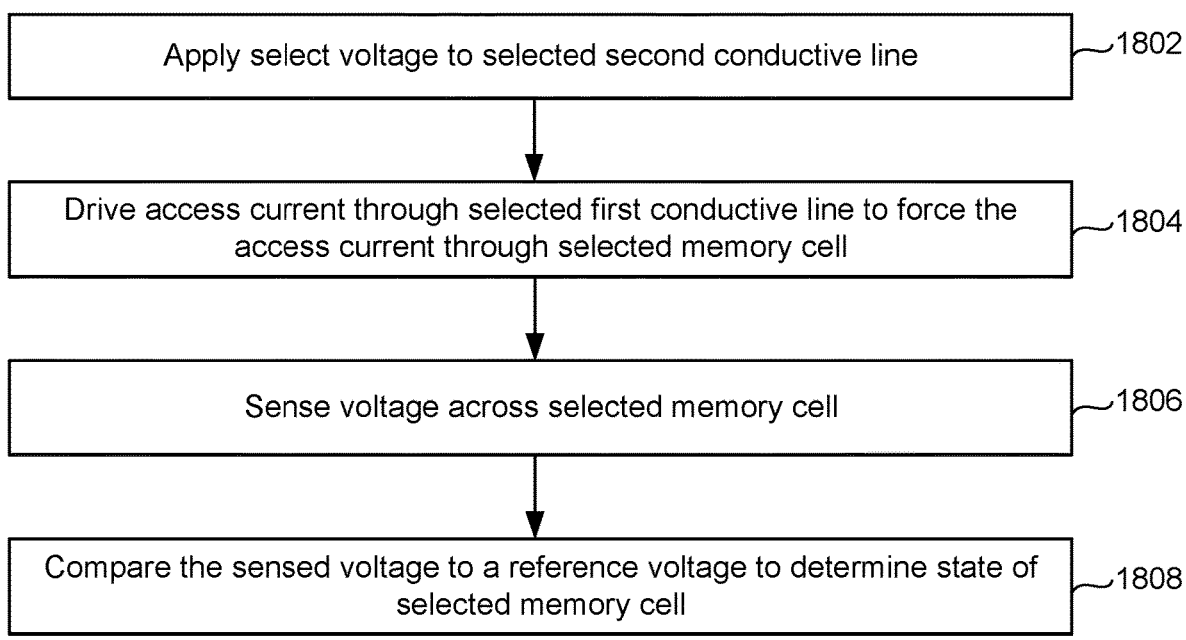
FIG. 18 is a flowchart depicting one embodiment of a process of current-force globally-referenced read.

FIG. 18 is a flowchart depicting one embodiment of a process 1800 of current-force globally-referenced read. In another embodiment, the globally-referenced read is a voltage-force globally-referenced read. Process 1800 is one embodiment of a faster read Type A. In one embodiment, the circuitry for performing Read Type A 150 controls process 1800. Circuitry 150 may control circuitry such as common read circuitry 170, power control 1664, column control circuitry 1610, and/or row control circuitry 1620. Process 1800 describes reading one memory cell. The process may be performed in parallel on the different memory cells in a group. The group may store an ECC codeword. FIG. 17 depicts an example unit that could be referred to as a tile. One cell in each of many such tiles could be read to read the ECC codeword. Step 1802 includes applying a select voltage to a selected second conductive line. With reference to FIG. 17, Vselect is provided to the selected bit line 1708b. Unselect voltages are provided to the unselected bit lines.

Step 1804 includes driving a read current to a selected word line to force the read current through the selected memory cell. With reference to FIG. 17, $I_{access}$ is driven into the selected word line 1706g. Access currents are not provided to the unselected word lines. The access current may flow through a portion of the selected word line, through the selected memory cell, and through a portion of the selected bit line. In particular, the access current may flow through the portion of the selected word line from where the word line is driven (by a current driver) to the selected memory cell. The access current may flow through the portion of the selected bit line from the selected memory cell to where the bit line is driven by the voltage driver.

Step 1806 includes sensing a voltage generated by the selected memory cell. In an embodiment, the voltage between the selected word line and the selected bit line at the selected memory cell is sensed.

Step 1808 includes comparing the sensed voltage to a reference voltage to determine a state of the memory cell. The magnitude of the reference voltage is independent of the physical state (e.g., resistance) of the memory cell. A common reference voltage may be used for different memory cells in the array. However, in some embodiments, the magnitude of the reference voltage may be based on a factor such as the location of the memory cell in the array. Therefore, the reference voltage is not required to have the exact same magnitude for all memory cells in the array. The memory device 106 may collect results for all of the memory cells in the group and send the results to the memory controller 102 on the data bus during the appropriate clock cycles based on the data out latency for the read type A. The memory controller 102 may decode the data with the ECC engine 158.

Figure 19:
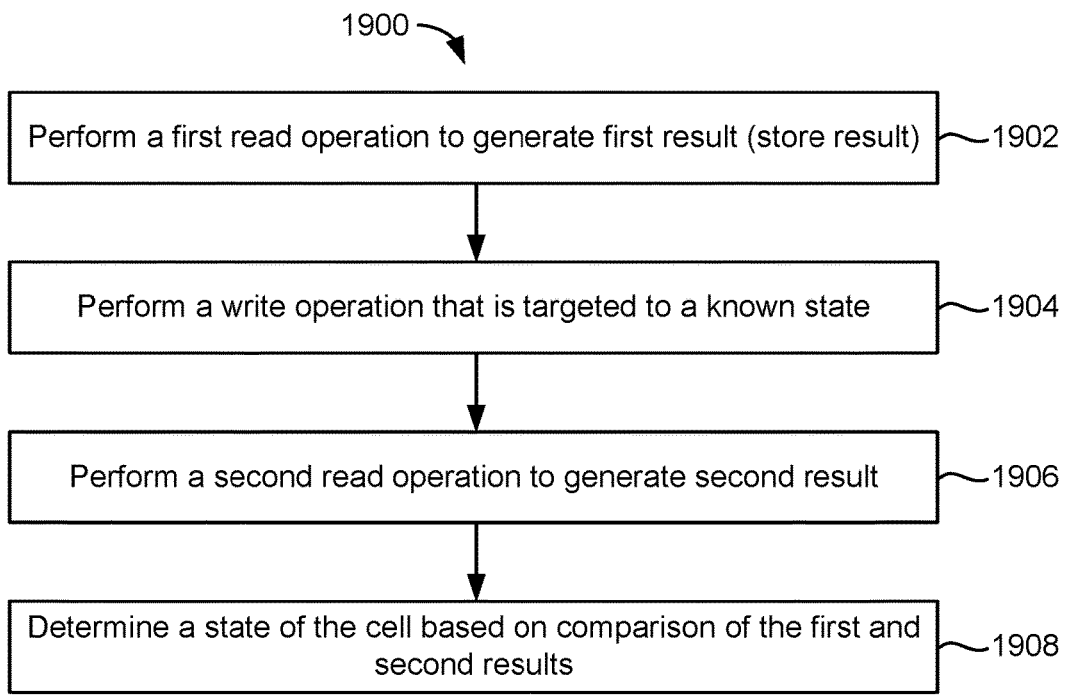
FIG. 19 is a flowchart of one embodiment of a process of reading programmable resistance memory cells with an SRR.

FIG. 19 is a flowchart of one embodiment of a process 1900 of reading programmable resistance memory cells with an SRR. The SRR of process 1900 takes longer to perform within the memory device 106 than the globally-referenced read in FIG. 18. The SRR is one embodiment of the slower Type B read. In one embodiment, the circuitry for performing Read Type B 160 controls process 1900. Circuitry 160 may control circuitry such as common read circuitry 170, power control 1664, column control circuitry 1610, and/or row control circuitry 1620. In one embodiment a group of memory cells that stores an ECC codeword is read. In one embodiment the group of memory cells reside in different tiles of a cross-point array. In one embodiment the memory cells are MRAM cells. In one embodiment, the memory cells each have a programmable resistance memory element in series with a threshold switching selector (e.g., OTS). In one embodiment, a forced-current approach is used. In one embodiment, a forced-voltage approach is used.

Step 1902 includes performing a first read operation to generate a first result. In one embodiment, steps 1802-1806 of process 1800 are used in step 1902. Step 1902 also includes storing the result. In one embodiment, the result is stored on a capacitor.

Step 1904 includes performing a write operation that targets a known state. For an MRAM embodiment the known state could be the AP-state or the P-state. The write signal writes the memory cell to the known state regardless of its pre-read state.

Step 1906 includes performing a second read operation of the memory cell to generate a second result. This second read operation may be similar to the first read operation of step 1902.

Step 1908 includes determining a state of the memory cell based on a comparison of the first read result with the second read result. This comparison may be performed in a number of ways. In one embodiment, the magnitude of the voltage from the first read is increased by some value such as, for example, 150 mV. If the write did not change the resistance of the memory cell then magnitude of the second read voltage should be lower than the up-adjusted magnitude of the first read voltage. However, in one embodiment, if the write did change the resistance of the memory cell, then the magnitude of the second read voltage should be higher than the adjusted magnitude of the first read voltage. This comparison process may vary depending on whether the first read voltage is adjusted up or down, and/or whether the write is to the AP-state or P-state. After performing process 1900 on each memory cell in the group any memory cells that had their state flipped by the write of step 1904 may be written back to their original states. The memory device 106 may collect results for all of the memory cells in the group and send the results to the memory controller 102 on the data bus during the appropriate clock cycles based on the data out latency for the read type B. The memory controller 102 may decode the data with the ECC engine 158.

In view of the foregoing, it can be seen that, according to an embodiment, an apparatus a communication interface configured to connect to read circuitry configured to read memory cells. The read circuitry is configured to perform a first type of read having a first performance time and a second type of read having a second performance time that is longer than the first performance time. The apparatus has one or more control circuits coupled to the communication interface. The one or more control circuits are configured to track expected usage of the communication interface to return data by the read circuitry in response to read commands of the first type and the second type. The first type of read command has a first data out latency and the second type of read command has a second data out latency that is longer than the first data out latency. The one or more control circuits are configured to control timing of issuance of read commands of the first type and the second type to meet a timing constraint for data returned from the read circuitry on the communication interface.

In a further embodiment, the timing constraint includes preventing a collision of data on the communication interface. The one or more control circuits are configured to control the timing of issuance of the read commands of the first type and the second type to avoid data collisions on the communication interface.

In a further embodiment, the timing constraint includes ensuring in order return of data on the communication interface from the read circuitry. The one or more control circuits are configured to control the timing of the issuance of the read commands of the first type and the second type to ensure that the read circuitry returns data in the same order as the read commands are issued.

In a further embodiment, the one or more control circuits are configured to maintain a timer that indicates an earliest time for the read circuitry to start a transfer of data on the communication interface for a new read command. The one or more control circuits are configured to issue the new read command in response to a determination that the data out latency for the new read command will result in the read circuitry starting data transfer on the communication interface no earlier than the earliest time. The new read command is either the first type of read or the second type of read.

In a further embodiment, the one or more control circuits are configured to update the timer responsive to issuing the new read command, including setting the timer to a sum of the data out latency and read data cycles of the new read command.

In a further embodiment, the one or more control circuits are configured to decrement the timer each idle clock cycle for which no read command is issued on the communication interface to the read circuitry.

In a further embodiment, the one or more control circuits are configured to issue a first read command of the first type after issuing a second read command of the second type, store a first address of the first read command and store a second address of the second read command, receive first data for the first read command on the communication interface prior to receiving second data for the second read command on the communication interface, access the stored first address and associate the first address with the first data, and access the stored second address and associate the second address with the second data.

In a further embodiment, the one or more control circuits are configured to record projected occupancy of the communication interface based on the issuance of the read commands of the first type and the second type. The projected occupancy indicates time slots for which data is projected to be returned from the read circuitry on the communication interface.

In a further embodiment, the one or more control circuits are configured to issue a particular read command to the read circuitry in response to a determination that the time slots for which the read circuitry is projected to return data for the particular read command on the communication interface does not collide with any time slots for which data for other read commands is projected to be returned from the read circuitry on the communication interface.

In a further embodiment, the first type of read comprises a globally-referenced read and the second type of read comprises a self-referenced read (SRR).

In a further embodiment, the memory cells comprise magnetoresistive random access memory (MRAM) cells.

A further aspect includes a method for reading memory. The method comprises determining, by a memory controller, first times to issue commands for a first type of read command having a first data out latency that will not result in a collision on a data interface. The method comprises issuing commands for the first type of read command from the memory controller over a command interface to a memory device at the first times. The method comprises determining, by the memory controller, second times to issue commands for a second type of read command having a second data out latency that will not result a collision on the data interface. The second data out latency is greater than the first data out latency. The method comprises issuing commands for the second type of read command from the memory controller over the command interface to the memory device at the second times.

A further aspect includes a memory system, comprising a plurality of memory cells, a first control circuit communicatively coupled to the plurality of memory cells, a data interface communicatively coupled to the first control circuit, a command interface communicatively coupled to the first control circuit, and a second control circuit communicatively coupled to the data interface and the command interface. The first control circuit is configured to perform a globally-referenced read of the memory cells and a self-referenced read of the memory cells. The second control circuit is configured to determine first times at which first commands of a first type of read having a first data out latency and second times at which second commands of a second type of read having a second data out latency can be issued on the command interface while avoiding data collisions on the data interface. The second data out latency is longer than the first data out latency. The second control circuit is configured issue the first commands at the first times on the command interface to instruct the first control circuit to perform the globally-referenced read. The second control circuit is configured issue the second commands at the second times on the command interface to instruct the first control circuit to perform the self-referenced read.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   a communication interface configured to connect to read circuitry that is configured to read memory cells, the read circuitry configured to perform a first type of read having a first performance time and a second type of read having a second performance time that is longer than the first performance time; and
   one or more control circuits coupled to the communication interface, the one or more control circuits configured to:
   track expected usage of the communication interface to return data by the read circuitry in response to read commands of the first type and the second type, wherein the first type of read command has a first data out latency and the second type of read command has a second data out latency that is longer than the first data out latency; and
   control timing of issuance of read commands of the first type and the second type to meet a timing constraint for data returned from the read circuitry on the communication interface.

2. The apparatus of claim 1, wherein:
   the timing constraint includes preventing a collision of data on the communication interface; and
   the one or more control circuits are configured to control the timing of issuance of the read commands of the first type and the second type to avoid data collisions on the communication interface.

3. The apparatus of claim 1, wherein:
   the timing constraint includes ensuring in order return of data on the communication interface from the read circuitry; and
   the one or more control circuits are configured to control the timing of the issuance of the read commands of the first type and the second type to ensure that the read circuitry returns data in the same order as the read commands are issued.

4. The apparatus of claim 3, wherein:
   the timing constraint further includes preventing a collision of the data on the communication interface; and
   the one or more control circuits are configured to control the timing of issuance of the read commands of the first type and the second type to avoid data collisions on the communication interface.

5. The apparatus of claim 4, wherein the one or more control circuits are configured to:
   maintain a timer that indicates an earliest time for the read circuitry to start a transfer of data on the communication interface for a new read command; and
   issue the new read command in response to a determination that the data out latency for the new read command will result in the read circuitry starting data transfer on the communication interface no earlier than the earliest time, wherein the new read command is either the first type of read or the second type of read.

6. The apparatus of claim 5, wherein the one or more control circuits are configured to:
update the timer responsive to issuing the new read command, including setting the timer to a sum of the data out latency and read data cycles of the new read command.

7. The apparatus of claim 6, wherein the one or more control circuits are configured to:
decrement the timer each idle clock cycle for which no read command is issued on the communication interface to the read circuitry.

8. The apparatus of claim 1, wherein the one or more control circuits are configured to:
issue a first read command of the first type after issuing a second read command of the second type;
store a first address of the first read command and store a second address of the second read command;
receive first data for the first read command on the communication interface prior to receiving second data for the second read command on the communication interface;
access the stored first address and associate the first address with the first data; and
access the stored second address and associate the second address with the second data.

9. The apparatus of claim 1, wherein the one or more control circuits are configured to:
record projected occupancy of the communication interface based on the issuance of the read commands of the first type and the second type, wherein the projected occupancy indicates time slots for which data is projected to be returned from the read circuitry on the communication interface.

10. The apparatus of claim 9, wherein the one or more control circuits are configured to:
issue a particular read command to the read circuitry in response to a determination that the time slots for which the read circuitry is projected to return data for the particular read command on the communication interface does not collide with any time slots for which data for other read commands is projected to be returned from the read circuitry on the communication interface.

11. The apparatus of claim 1, wherein:
the first type of read comprises a globally-referenced read; and
the second type of read comprises a self-referenced read (SRR).

12. The apparatus of claim 1, wherein the memory cells comprise magnetoresistive random access memory (MRAM) cells.

13. A method for reading memory, the method comprising:
determining, by a memory controller, first times to issue commands for a first type of read command having a first data out latency that will not result in a collision on a data interface;
issuing commands for the first type of read command from the memory controller over a command interface to a memory device at the first times;
determining, by the memory controller, second times to issue commands for a second type of read command having a second data out latency that will not result a collision on the data interface, wherein the second data out latency is greater than the first data out latency; and
issuing commands for the second type of read command from the memory controller over the command interface to the memory device at the second times.

14. The method of claim 13, further comprising:
performing, by the memory device, globally-referenced reads for the commands of the first type of read command;
returning data for the commands of the first type of read command from the memory device over the data interface to the memory controller;
performing, by the memory device, self-referenced reads for the commands of the second type of read command; and
returning data for the commands of the second type of read command from the memory device over the data interface to the memory controller.

15. The method of claim 13, wherein determining first times to issue commands for the first type of read command and second times to issue commands for the second type of read command includes:
maintaining a timer that indicates an earliest available time slot for the memory device to initiate return of data on the data interface for a new read command, including resetting the timer in response to issuing commands for the first type of read and commands for the second type of read;
determining the first times based on whether the first data out latency is at least equal to the earliest available time slot at a current clock cycle; and
determining the first times based on whether the second data out latency is at least equal to the earliest available time slot at a current clock cycle.

16. The method of claim 13, wherein determining first times to issue commands for the first type of read command and second times to issue commands for the second type of read command includes:
recording projected future occupancies of the data interface based on the issuance of the first type of read commands and the second type of read commands to the memory device;
determining the first times based on the future occupancies, the first data out latency, and a first read cycle for the first type of read command; and
determining the second times based on the future occupancies, the second data out latency, and a second read cycle for the second type of read command.

17. A memory system, comprising:
a plurality of memory cells;
a first control circuit communicatively coupled to the plurality of memory cells, the first control circuit configured to perform a globally-referenced read of the memory cells and a self-referenced read of the memory cells;
a data interface communicatively coupled to the first control circuit;
a command interface communicatively coupled to the first control circuit; and
a second control circuit communicatively coupled to the data interface and the command interface, wherein the second control circuit is configured to:
determine first times at which first commands of a first type of read having a first data out latency and second times at which second commands of a second type of read having a second data out latency can be issued on the command interface while avoiding data collisions on the data interface, wherein the second data out latency is longer than the first data out latency;

issue the first commands at the first times on the command interface to instruct the first control circuit to perform the globally-referenced read; and issue the second commands at the second times on the command interface to instruct the first control circuit to perform the self-referenced read.

18. The memory system of claim 17, wherein the second control circuit is further configured to:

maintain a timer that indicates an earliest available time slot for the first control circuit to start a transfer of data on the data interface for a new read command; and issue the new read command in response to a determination that the data out latency for the new read command will result in the first control circuit starting data transfer on the data interface no earlier than the earliest available time slot, wherein the new read command is either the first type of read or the second type of read.

19. The memory system of claim 17, wherein the second control circuit is further configured to record projected future occupancy of the data interface based on the issuance of the first commands and the second commands, wherein the future occupancy indicates time slots for which data is projected to be returned on the data interface by the first control circuit; and issue a particular read command in response to a determination that the time slots for which the data is projected to be returned for the particular read command does not collide with any time slots for which data for other read commands is projected to be returned on the data interface.

20. The memory system of claim 17, wherein the second control circuit is further configured to control timing of the issuance of commands of the first type of read and commands of the second type of read over the command interface to the first control circuit to ensure in order return of data from the first control circuit over the data interface.

* * * * *